(12) United States Patent
Mishra et al.

(10) Patent No.: US 11,907,154 B2
(45) Date of Patent: Feb. 20, 2024

(54) LATENCY AND POWER EFFICIENT CLOCK AND DATA RECOVERY IN A HIGH-SPEED ONE-WIRE BIDIRECTIONAL BUS

(71) Applicant: QUALCOMM Incorporated, San Diego, CA (US)

(72) Inventors: Lalan Jee Mishra, Escondido, CA (US); Umesh Srikantiah, San Diego, CA (US); Francesco Gatta, San Diego, CA (US); Muhlis Kenan Ozel, San Diego, CA (US); Richard Dominic Wietfeldt, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/861,886

(22) Filed: Jul. 11, 2022

(65) Prior Publication Data

US 2024/0012778 A1 Jan. 11, 2024

(51) Int. Cl.
*G06F 13/40* (2006.01)
*H04L 7/00* (2006.01)
*H04L 7/04* (2006.01)

(52) U.S. Cl.
CPC ........ *G06F 13/4068* (2013.01); *H04L 7/0066* (2013.01); *H04L 7/0087* (2013.01); *H04L 7/042* (2013.01); *G06F 2213/40* (2013.01)

(58) Field of Classification Search
CPC ............ G06F 13/4068; G06F 2213/40; H04L 7/0066; H04L 7/0087; H04L 7/042
See application file for complete search history.

(56) References Cited

U.S. PATENT DOCUMENTS

| 9,106,233 | B1* | 8/2015 | Rosen ................. H03K 5/135 |
| 2005/0175133 | A1 | 8/2005 | Hauser et al. |
| 2006/0062341 | A1* | 3/2006 | Edmondson .......... H03L 7/0814 375/376 |
| 2015/0063515 | A1* | 3/2015 | Mori ................... H04L 27/2338 375/361 |
| 2017/0093558 | A1* | 3/2017 | Ramezani ............ H04L 7/0029 |
| 2019/0171595 | A1* | 6/2019 | Mishra ............... G06F 13/4291 |
| 2020/0084015 | A1* | 3/2020 | Manian ................ H04L 7/0004 |
| 2021/0119633 | A1 | 4/2021 | Chattopadhyay |

OTHER PUBLICATIONS

International Search Report and Written Opinion—PCT/US2023/023840—ISA/EPO—dated Sep. 15, 2023.

* cited by examiner

*Primary Examiner* — Henry Tsai
*Assistant Examiner* — Harry Z Wang
(74) *Attorney, Agent, or Firm* — Loza & Loza, LLP/Qualcomm

(57) ABSTRACT

A receive clock generated at a receiver coupled to a one-wire bus is synchronized in each clock cycle, permitting reception of a data frame of unlimited length without clock overrun or underrun. A base clock signal provided by an oscillator is passed by a clock gating circuit while the clock gating circuit is enabled. A counter counts positive and negative edges in an output of the clock gating circuit. The clock gating circuit is disabled when an output of the counter indicates a preconfigured maximum count value. An edge synchronization circuit that synchronizes edges in the base clock signal with edges in a data signal received over the one-wire bus ignores edges in the data signal while the counter output has a value that is less than the maximum count value, and resets the counter in response to an edge detected in the data signal received over the one-wire bus.

30 Claims, 23 Drawing Sheets

LATENCY AND POWER EFFICIENT CLOCK AND DATA RECOVERY IN A HIGH-SPEED ONE-WIRE BIDIRECTIONAL BUS

TECHNICAL FIELD

The present disclosure relates generally to serial communication and, more particularly, to clock generation at receivers coupled to a one-wire communication bus.

BACKGROUND

Mobile communication devices may include a variety of components including circuit boards, integrated circuit (IC) devices and/or System-on-Chip (SoC) devices. The components may include processing circuits, user interface components, storage and other peripheral components that communicate through a serial bus. The serial bus may be operated in accordance with a standardized or proprietary protocol. In one example, a serial bus is operated in accordance with an Inter-Integrated Circuit (I2C bus or I²C) protocol. The I2C bus was developed to connect low-speed peripherals to a processor, where the I2C bus is configured as a multi-drop bus. A two-wire I2C bus includes a Serial Data Line (SDA) that carries a data signal, and a Serial Clock Line (SCL) that carries a clock signal. In another example, the Improved Inter-Integrated Circuit (I3C) protocols defined by the Mobile Industry Processor Interface (MIPI) Alliance derive certain implementation aspects from the I2C protocol including separate clock and data lines.

In another example, the Radio Frequency Front-End (RFFE) interface defined by the MIPI Alliance provides a communication interface for controlling various radio frequency (RF) front-end devices, including power amplifiers (PAs), low-noise amplifiers (LNAs), antenna tuners, filters, sensors, power management devices, switches, etc. These devices may be collocated in a single IC device or provided in multiple IC devices. In another example, the system power management interface (SPMI) defined by the MIPI Alliance provides a hardware interface that may be implemented between baseband or application processors and peripheral components. In some implementations, the SPMI is deployed to support power management operations within a device.

The use of MIPI-defined serial buses in place of parallel buses can reduce the number of physical general-purpose input/output (GPIO) pins required to support communication between multiple devices. However, as device complexity increases, demand for GPIO pins also increases and there is demand for more simplified bus architectures, including bus architectures that support communication through a single GPIO pin and over a single wire.

SUMMARY

Certain aspects of the disclosure relate to systems, apparatus, methods and techniques that enable clock generation at a receiving device sufficient to support communication over a single-wire serial bus. Clock signals generated at the receiver are synchronized to every transition in a Manchester-encoded signal that encodes a data bit. In some examples, transmitter clock signal used to generate the Manchester-encoded signal is reconstructed and can serve as a replacement for a clock signal that would have been transmitted over a two-wire serial bus. Phase and frequency errors can be accommodated and accumulation of such errors is prevented. The single-wire link may format datagrams in accordance with RFFE, SPMI or another standards-defined protocol.

In various aspects of the disclosure, a clock and data recovery apparatus includes an oscillator configured to generate a base clock signal with a base frequency, a clock gating circuit responsive to one or more control inputs and configured to output a gated base clock signal while the clock gating circuit is enabled, a first counter clocked by the gated base clock signal and configured to provide a counter output that reflects a count of positive and negative edges in the gated base clock signal, control logic coupled to a first control input of the clock gating circuit and configured to disable the clock gating circuit when the counter output corresponds to a maximum count value, and an edge synchronization circuit coupled to a one-wire bus. The edge synchronization circuit may be configured to ignore edges in a signal received from the one-wire bus while the counter output has a value that is less than the maximum count value, and reset the first counter in response to an edge detected in the signal received from the one-wire bus.

In various aspects of the disclosure, a method of data communication includes configuring an oscillator to generate a base clock signal with a base frequency, configuring a clock gating circuit to output a gated base clock signal while the clock gating circuit is enabled, the clock gating circuit being responsive to one or more control inputs, configuring a first counter to provide a counter output that reflects a count of positive and negative edges in the gated base clock signal that clocks the first counter, configuring control logic to disable the clock gating circuit when the counter output corresponds to a maximum count value, and configuring an edge synchronization circuit. The edge synchronization circuit may be configured to ignore edges in a signal received by the edge synchronization circuit from a one-wire bus while the counter output has a value that is less than the maximum count value, and reset the first counter in response to an edge detected in the signal received from the one-wire bus.

In various aspects of the disclosure, a data communication apparatus includes means for generating a base clock signal with a base frequency, means for gating the base clock signal, including a clock gating circuit responsive to one or more control inputs, the means for gating the base clock signal being configured to output a gated base clock signal while the clock gating circuit is enabled, means for counting positive and negative edges in the gated base clock signal, including a first counter clocked by the gated base clock signal, means for disabling the clock gating circuit, including control logic coupled to a first control input of the clock gating circuit, the means for disabling the clock gating circuit being configured to disable the clock gating circuit when an output of the first counter corresponds to a maximum count value, and means for synchronizing the means for counting positive and negative edges in the signal received from a one-wire bus. The means for synchronizing may be configured to ignore edges in the signal received from the one-wire bus while the output of the first counter represents a value that is less than the maximum count value, and reset the first counter in response to an edge detected in the signal received from the one-wire bus.

In various aspects of the disclosure, a computer-readable medium stores code thereon and the code, when executed by a processor in a processing circuit causes the processing circuit to configure an oscillator to generate a base clock signal with a base frequency, configure a clock gating circuit to output a gated base clock signal while the clock gating circuit is enabled, the clock gating circuit being responsive to one or more control inputs, configure a first counter to provide a counter output that reflects a count of positive and negative edges in the gated base clock signal that clocks the first counter, configure control logic to disable the clock gating circuit when the counter output corresponds to a maximum count value, and configure an edge synchronization circuit. The edge synchronization circuit may be configured to ignore edges in a signal received by the edge synchronization circuit from a one-wire bus while the counter output has a value that is less than the maximum count value, and further configured to reset the first counter in response to an edge detected in the signal received from the one-wire bus.

In one aspect, the signal received from the one-wire bus is Manchester-encoded based on an encoding clock having a frequency that is four times greater than the base frequency of the base clock signal. In one example, the encoding clock has a frequency of at least 52 MHz.

In one aspect, the clock and data recovery apparatus includes a flipflop configured to capture a data bit from the one-wire bus in response to an edge detected in the signal received from the one-wire bus. A signal output by the control logic that disables the clock gating circuit may be used to clock the flipflop.

In one aspect, a signal output by the control logic that disables the clock gating circuit is used to generate a write clock signal that is output by the clock and data recovery apparatus.

In one aspect, the clock and data recovery apparatus includes a second counter clocked by the signal received from the one-wire bus. The second counter may be configured to drive a second control input of the clock gating circuit. The second counter may be held in a reset state when the one-wire bus is idle and until a sequence start condition (SSC) is detected in the signal received from the one-wire bus. The second counter may be configured to halt counting when an expected number of synchronization pulses have been counted in the signal received from the one-wire bus. The clock gating circuit may be disabled until the second counter halts counting. The second counter may be reset when an output by the control logic that disables the clock gating circuit is used to generate a write clock signal that is output by the clock and data recovery apparatus.

In one aspect, the signal received from the one-wire bus carries a datagram configured in accordance with a Radio Frequency Front-End (RFFE) protocol and encoded using Manchester encoding.

DETAILED DESCRIPTION

Figure 1:
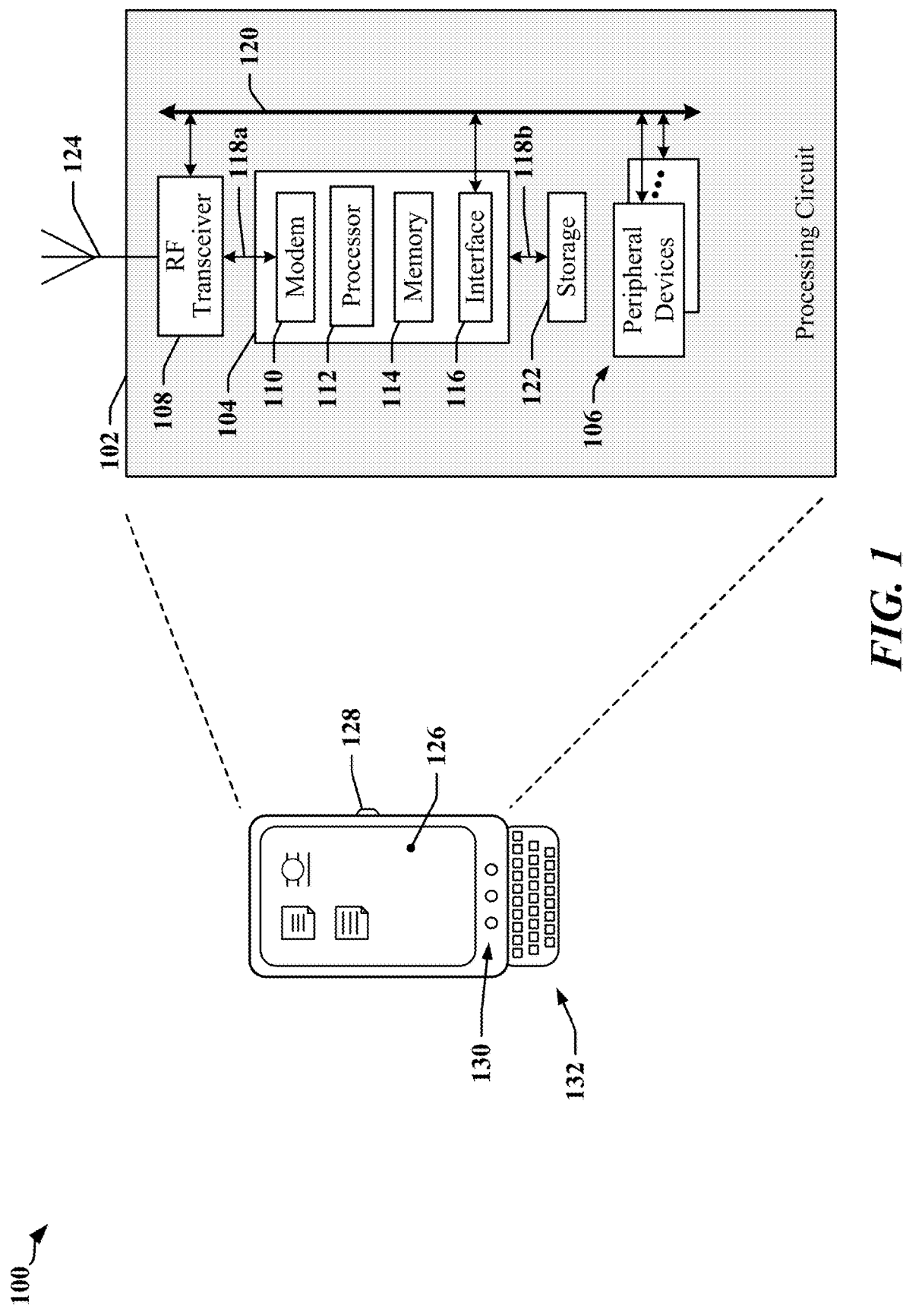
FIG. 1 illustrates an apparatus employing a data link between IC devices that is selectively operated according to one of plurality of available standards.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Certain aspects of the disclosure relate to communication of digital signals that include transitions between two or more signaling states. For the purpose of this description, transitions between two signaling states in a digital signal may be referred to as edges. Transitions from a low voltage signaling state to a higher voltage signaling state may be referred to as a positive edge, a positive transition, a rising edge, a rising transition or a positive-transitioning edge. Transitions to a low voltage signaling state from a higher voltage signaling state may be referred to as a negative edge, a negative transition, a falling edge, a falling transition or a negative-transitioning edge.

Certain aspects of the disclosure relate to serial bus configurations in which multiple devices can communicate at various times. The described serial buses are typically operated in a hierarchical manner, in that one device controls communication during a transaction. The controlling device may be referred to as a host device, a bus master device, a managing device or another term favored by standards defining the protocols implemented by the controlling device. In some serial bus configurations, a single controlling device manages or controls communication during all transactions conducted over the serial bus. In other serial bus configurations, multiple devices can operate as the controlling device and one device serves as the controlling device for each transaction conducted over the serial bus. The controlling device may provide a common clock signal that is transmitted over a conventional two-wire serial bus. The controlling device may provide control signaling that identifies a type of transaction to be conducted over a conventional two-wire serial bus. During certain transactions, a controlling device may transmit commands directed to one or more receiving devices using address information provided in or with the commands. The receiving devices may be referred to as a client device, a slave device, a subordinate device, a peripheral device or another term favored by standards defining the protocols implemented by the controlling device. For the purposes of this disclosure, a controlling device will be referred to as a bus master device and associated receiving devices will be referred to as slave devices.

Overview

Devices that include multiple SoC and other IC devices often employ a shared communication interface that may include a serial bus or other data communication link to connect processors with modems and other peripherals. The serial bus or other data communication link may be operated in accordance with multiple standards or protocols. For example, the serial bus may be operated in accordance with an I2C, I3C, SPMI, and/or RFFE protocol, or another protocol that may be configured for half-duplex operation. Increased functionality and complexity of operations involving devices coupled to serial buses, together with the imposition of more stringent timing constraints in support of applications, peripherals and sensors can result in greater demand on GPIO pins and communication link throughput.

Certain aspects of the disclosure relate to techniques for communication over a single wire bus, using Manchester encoding and synchronization signaling that can be distinguished by devices coupled to the single wire bus. The synchronization signaling may be configured to enable receiving devices to synchronize clock signals generated in a device that is currently transmitting over the single wire bus. In one aspect, a bus master device may be adapted to format datagrams in accordance with RFFE or SPMI protocols. Clock generation circuits are described herein that can be used in slave device to generate receive clocks from certain transitions in a Manchester-encoded signal. The receive clocks can be resynchronized in every bit transmission interval, eliminating the possibility of accumulation of the effects of transmission errors on phase and frequency of the Manchester-encoded signal or on the receive clocks.

In accordance with certain aspects of this disclosure, a receive clock generated at a receiver coupled to a one-wire bus is synchronized in each clock cycle, permitting reception of a data frame of unlimited length without clock overrun or underrun. A base clock signal provided by an oscillator is passed by a clock gating circuit while the clock gating circuit is enabled. A counter counts positive and negative edges in the output of the clock gating circuit. The clock gating circuit is disabled when an output of the counter indicates a preconfigured maximum count value. An edge synchronization circuit that synchronizes edges in the base clock signal with edges in a data signal received over the one-wire bus ignores edges in the data signal while the counter output has a value that is less than the maximum count value, and resets the counter in response to an edge detected in the signal received from the one-wire bus. The edge synchronization circuit may synchronize an edge in the base clock signal with the first-occurring edge in the data signal after the counter output reaches the maximum count value.

Certain aspects disclosed herein provide protocols that may replace or supplement a serial bus protocol, such as an I2C, I3C, SPMI, and/or RFFE protocol. Certain aspects are applicable to a serial bus operated in half-duplex mode or full-duplex mode.

Examples of Apparatus that Employ Serial Data Links

According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

FIG. 1 illustrates an example of an apparatus 100 that may employ a data communication bus. The apparatus 100 may include a processing circuit 102 having multiple circuits or devices 104, 106 and/or 108, which may be implemented in one or more ASICs or in an SoC. In one example, the apparatus 100 may be a communication device and the processing circuit 102 may include a processing device provided in an ASIC 104, one or more peripheral devices 106, and a transceiver 108 that enables the apparatus to communicate through an antenna 124 with a radio access network, a core access network, the Internet and/or another network.

The ASIC 104 may have one or more processors 112, one or more modems 110, on-board memory 114, a bus interface circuit 116 and/or other logic circuits or functions. The processing circuit 102 may be controlled by an operating system that may provide an application programming interface (API) layer that enables the one or more processors 112 to execute software modules residing in the on-board memory 114 or other processor-readable storage 122 provided on the processing circuit 102. The software modules may include instructions and data stored in the on-board memory 114 or processor-readable storage 122. The ASIC 104 may access its on-board memory 114, the processor-readable storage 122, and/or storage external to the processing circuit 102. The on-board memory 114, the processor-readable storage 122 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 124, a display 126, operator controls, such as switches or buttons 128, 130 and/or an integrated or external keypad 132, among other components. A user interface module may be configured to operate with the display 126, external keypad 132, etc. through a dedicated communication link or through one or more serial data interconnects.

The processing circuit 102 may provide one or more buses 118a, 118b, 120 that enable certain devices 104, 106, and/or 108 to communicate. In one example, the ASIC 104 may include a bus interface circuit 116 that includes a combination of circuits, counters, timers, control logic and other configurable circuits or modules. In one example, the bus interface circuit 116 may be configured to operate in accordance with communication specifications or protocols. The processing circuit 102 may include or control a power management function that configures and manages the operation of the apparatus 100.

Figure 2:
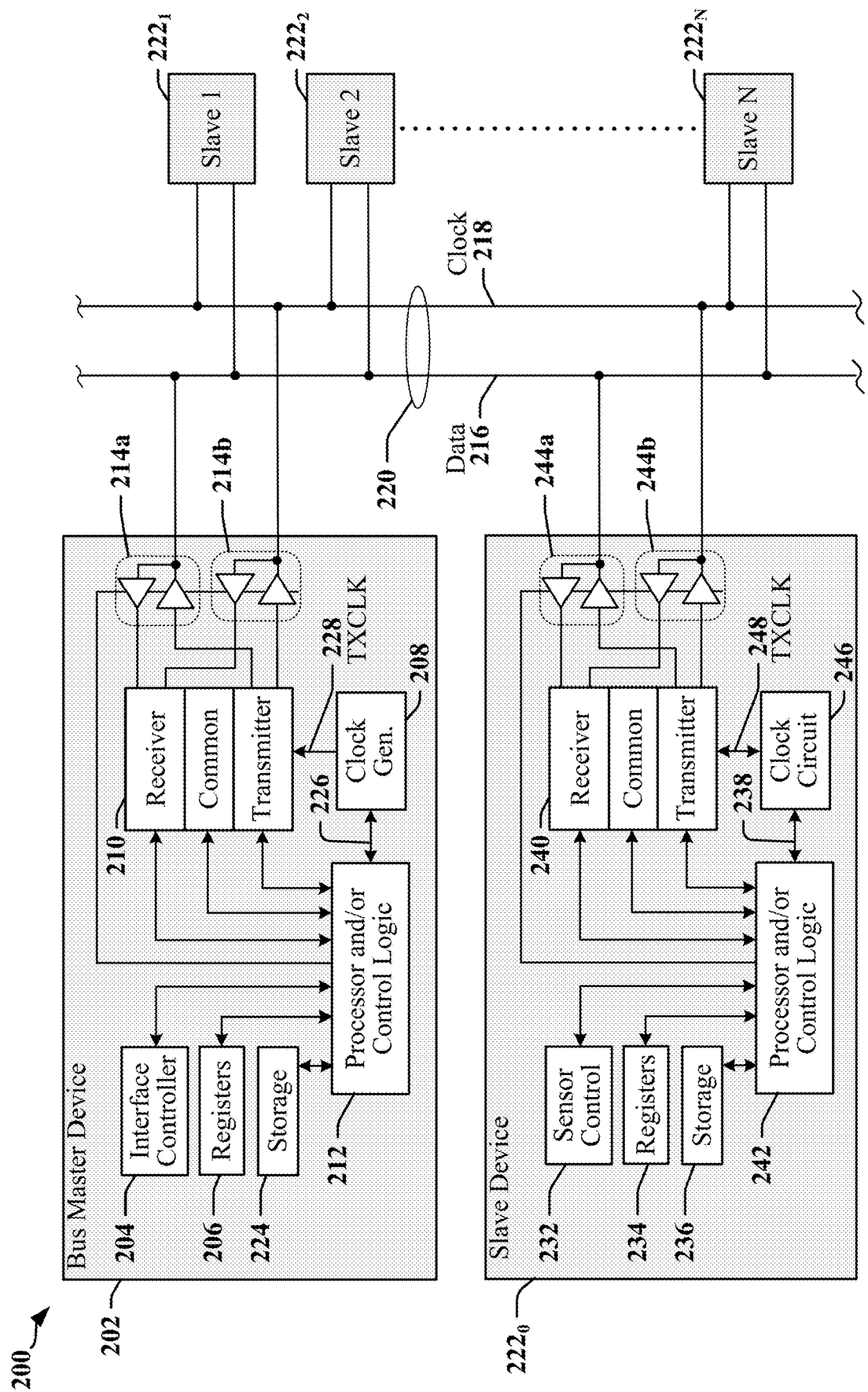
FIG. 2 illustrates a first example of an apparatus employing a data link that may be used to communicatively couple two or more devices.

FIG. 2 illustrates a first example of an apparatus 200 employing a data link that may be used to communicatively couple two or more devices. Here, the apparatus 200 includes multiple devices 202, and $222_0$-$222_N$ coupled to a two-wire serial bus 220. The devices 202 and $222_0$-$222_N$ may be implemented in one or more semiconductor IC devices, such as an application processor, SoC or ASIC. In various implementations certain of the devices 202 and $222_0$-$222_N$ may include, support or operate as a modem, a signal processing device, a display driver, a camera, a user interface, a sensor, a sensor controller, a media player, a transceiver, and/or other such components or devices. In some examples, one or more devices $222_0$-$222_N$ may be used to control, manage or monitor a sensor device. Communication between devices 202 and $222_0$-$222_N$ over the serial bus 220 is controlled by a bus master device 202. Certain types of bus can support multiple bus masters 202.

In one example, a bus master device 202 may include an interface controller 204 that may manage access to the serial bus, configure dynamic addresses for slave devices and/or generate a clock signal 228 to be transmitted on a clock line 218 of the serial bus 220. The bus master device 202 may include configuration registers 206 or other storage 224, and other control logic 212 configured to handle protocols and/or higher-level functions. The control logic 212 may include a processing circuit such as a state machine, sequencer, signal processor or general-purpose processor. The bus master device 202 includes a transceiver 210 and line drivers/receivers 214a and 214b. The transceiver 210 may include receiver, transmitter and common circuits, where the common circuits may include timing, logic and storage circuits and/or devices. In one example, the transmitter encodes and transmits data based on timing in the clock signal 228 provided by a clock generation circuit 208. Other timing clocks 226 may be used by the control logic 212 and other functions, circuits or modules.

One or more devices $222_0$-$222_N$ may be configured to operate as a slave device. In some examples, a slave device may include circuits and modules that support a display, an image sensor, and/or circuits and modules that control and communicate with one or more sensors that measure environmental conditions. In one example, a device $222_0$ configured to operate as a slave device may provide a control function, module or circuit 232 that includes circuits and modules to support a display, an image sensor, and/or circuits and modules that control and communicate with one or more sensors that measure environmental conditions. In this example, the device $222_0$ can include configuration registers 234 or other storage 236, control logic 242, a transceiver 240 and line drivers/receivers 244a and 244b. The control logic 242 may include a processing circuit such as a state machine, sequencer, signal processor or general-purpose processor. The transceiver 240 may include receiver, transmitter and common circuits, where the common circuits may include timing, logic and storage circuits and/or devices. In one example, the transmitter encodes and transmits data based on timing in a clock signal 248 provided by clock generation and/or recovery circuits 246. In some instances, the clock signal 248 may be derived from a signal received from the clock line 218. Other timing clocks 238 may be used by the control logic 242 and other functions, circuits or modules.

The serial bus 220 may be operated in accordance with RFFE, I2C, I3C, SPMI, or other protocols. At least one of the devices 202 and $222_0$-$222_N$ may be configured to operate as a bus master device and a slave device on the serial bus 220. Two or more of the devices 202 and $222_0$-$222_N$ may be configured to operate as a bus master device on the serial bus 220. The protocol selected to control operation of the serial bus 220 may define direct current (DC) characteristics affecting certain signal levels associated with the serial bus 220, and/or alternating current (AC) characteristics affecting certain timing aspects of signals transmitted on the serial bus 220. In various examples, a 2-wire serial bus 220 transmits data on a data line 216 and a clock signal on the clock line 218. In some instances, data may be encoded in the signaling state, or transitions in signaling state of the data line 216 and the clock line 218.

Figure 3:
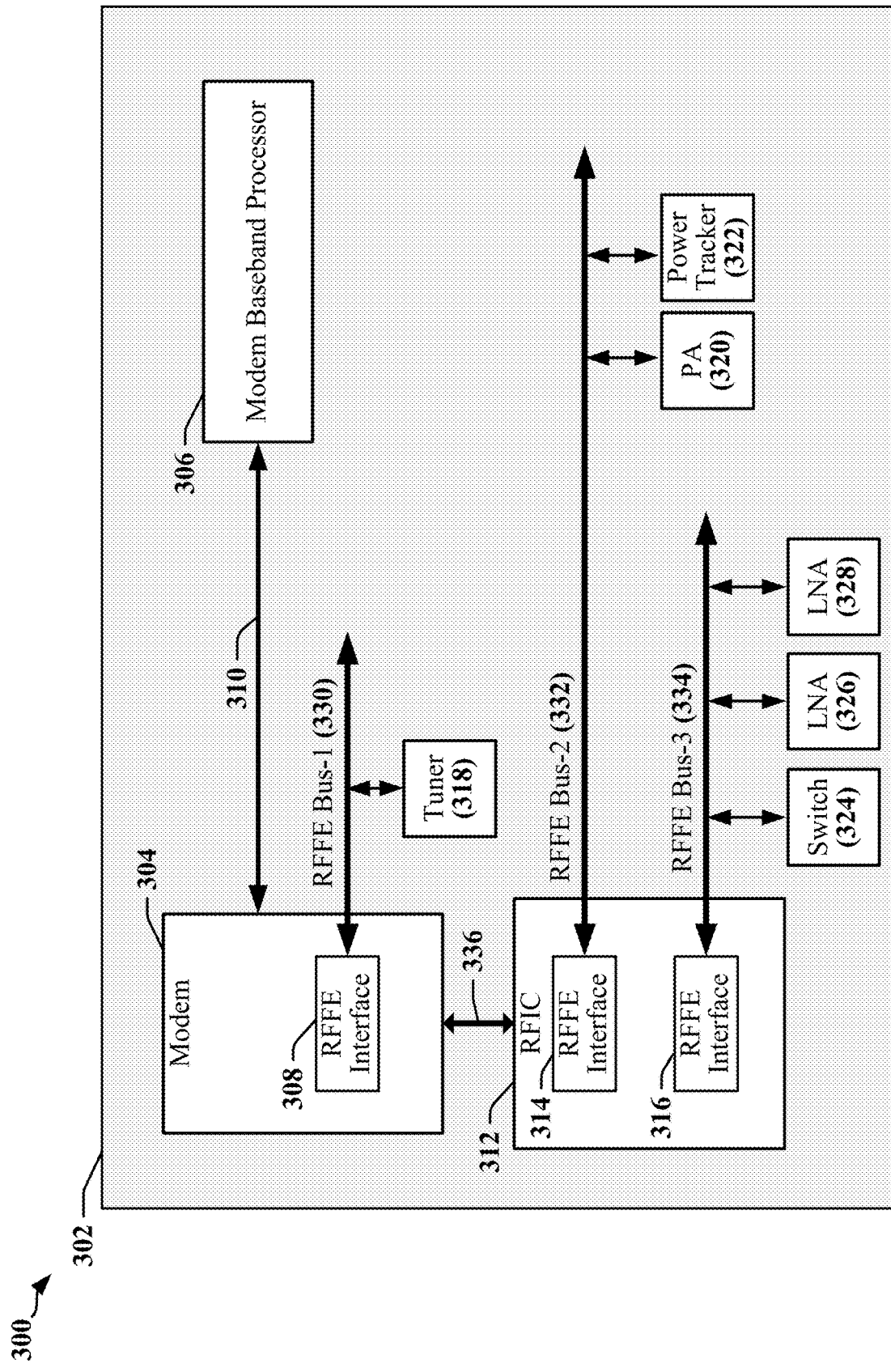
FIG. 3 illustrates a second example of an apparatus employing data links that may be used to communicatively couple two or more devices, including various radio frequency front-end devices.

FIG. 3 illustrates a second example of an apparatus 300 employing data links that may be used to communicatively couple two or more devices. In this example, a chipset or device 302 employs multiple RFFE buses 330, 332, 334 to couple various RF front-end devices 318, 320, 322, 324, 326, 328. A modem 304 includes an RFFE interface 308 that couples the modem 304 to a first RFFE bus 330. The modem 304 may communicate with a baseband processor 306 and a Radio-Frequency IC (RFIC 312) through one or more communication links 310, 336. The illustrated device 302 may be embodied in one or more of a mobile communication device, a mobile telephone, a mobile computing system, a notebook computer, a tablet computing device, a media player, a gaming device, a wearable computing and/or communication device, an appliance, or the like.

In various examples, the device 302 may be implemented with one or more baseband processors 306, modems 304, RFICs 312, multiple communication links 310, 336, multiple RFFE buses 330, 332, 334 and/or other types of buses. The device 302 may include other processors, circuits, modules and may be configured for various operations and/or different functionalities. In the example illustrated in FIG. 3, the Modem is coupled to an RF tuner 318 through its RFFE interface 308 and the first RFFE bus 330. The RFIC 312 may include one or more RFFE interfaces 314, 316, controllers, state machines and/or processors that configure and control certain aspects of the RF front-end. The RFIC 312 may communicate with a PA 320 and a power tracking module 322 through a first of its RFFE interfaces 314 and a second RFFE bus 332. The RFIC 312 may communicate with a switch 324 and one or more LNAs 326, 328 through a second of its RFFE interfaces 316 and a third RFFE bus 334.

Bus latency can affect the ability of a serial bus to handle high-priority, real-time and/or other time-constrained messages. Low-latency messages, or messages requiring low bus latency, may relate to sensor status, device-generated real-time events and virtualized GPIO state. In one example, bus latency may be measured as the time elapsed between a message becoming available for transmission and the delivery of the message or, in some instances, commencement of transmission of the message. Other measures of bus latency may be employed. Bus latency typically includes delays incurred while higher priority messages are transmitted, interrupt processing, the time required to terminate a datagram in process on the serial bus, the time to transmit commands causing bus turnaround between transmit mode and receive mode, bus arbitration and/or command transmissions specified by protocol.

In certain examples, latency-sensitive messages may include coexistence messages. Coexistence messages are transmitted in a multisystem platform to prevent or reduce instances of certain device types impinging on each other, including for example, switches 324, LNAs 326, 328, PAs 320 and other types of device that operate concurrently in a manner that can generate inter-device interference, or that could potentially cause damage to one or more devices. Devices that may interfere with one another may exchange coexistence management (CxM) messages to permit each device to signal imminent actions that may result in interference or conflict. CxM messages may be used to manage operation of shared components including a switch 324, LNA 326, 328, PA 320 and/or an antenna.

Multi-drop interfaces such as RFFE, SPMI, I3C, etc. can reduce the number of physical input/output (I/O) pins used to communicate between multiple devices. Protocols that support communication over a multi-drop serial bus define a datagram structure used to transmit command, control and data payloads. Datagram structures for different protocols define certain common features, including addressing used to select devices to receive or transmit data, clock generation and management, interrupt processing and device priorities. In this disclosure, the example of RFFE protocols may be employed to illustrate certain aspects disclosed herein. However, the concepts disclosed herein are applicable to other serial bus protocols and standards.

Figure 4:
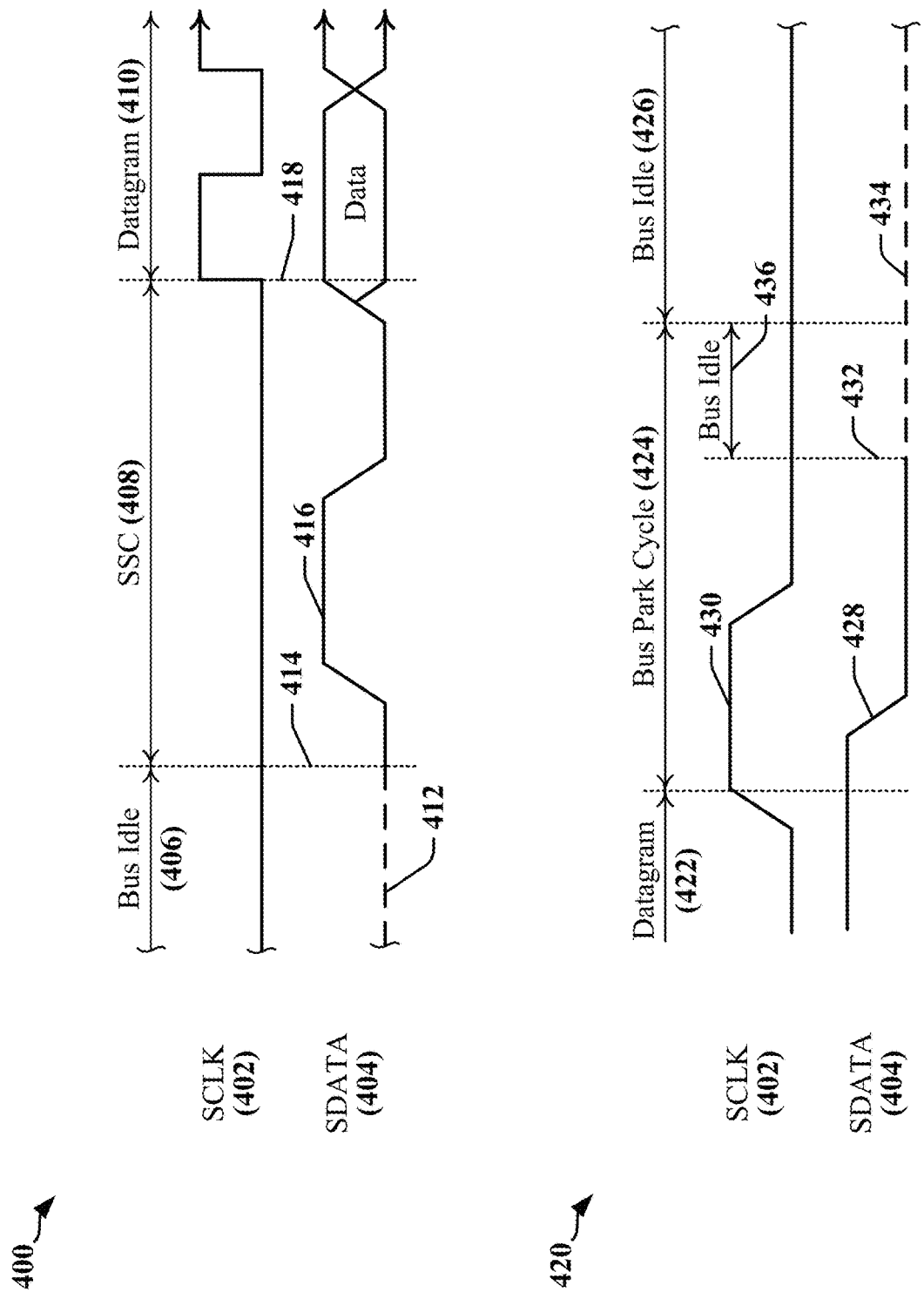
FIG. 4 includes timing diagrams that illustrate signaling transmitted to delineate the boundaries of RFFE and SPMI datagrams.

FIG. 4 includes timing diagrams 400, 420 that illustrate signaling that is transmitted to delineate the boundaries of datagrams transmitted in accordance with RFFE protocols. The timing diagrams 400, 420 show the relative timing of signals transmitted on a 2-wire serial bus that provides a clock signal on SCLK 402 and provides for exchange of data over SDATA 404. The first timing diagram 400 illustrates timing of a sequence start condition (SSC 408) that is transmitted to signal the start of a transaction such as the transmission of a datagram 410. The SSC 408 is transmitted when the serial bus is in an idle state 406. In the idle state 406, SCLK 402 is driven at full strength by a bus master while slave devices coupled to the serial bus present a high impedance to SCLK 402. SCLK 402 is held in the low signaling state (here, at zero volts) by the bus master. In the idle state 406, SDATA 404 is weakly driven by the bus master or is held in the weakly driven low signaling state 412 using a keeper circuit or a weak pull-down circuit. A keeper circuit or a weak pull-down circuit may maintain the signaling state of SDATA 404, for example, when the bus master has caused its line driver to enter a high impedance state and when no other device is driving SDATA 404. The weakly driven low signaling state 412 can easily be overcome by another line driver that can drive SDATA 404 at full strength.

In a master-driven SSC 408, the bus master commences transmission of the SSC 408 at a first point in time 414 when it begins to drive SDATA 404 at full strength, initially at the low signaling state. The bus master then provides a pulse 416 on SDATA 404 while continuing to drive SCLK 402 to the low signaling state. The pulse 416 has duration of at least one cycle of a clock signal provided on SCLK 402 during transmission of a datagram 410. At a second point in time 418, the bus master commences transmission of clock pulses on SCLK 402, thereby providing the clock signal used to control or indicate timing of a datagram 410 transmitted on SDATA 404.

The second timing diagram 420 illustrates timing of a bus park cycle (the BPC 424) that may be transmitted to signal the termination of a datagram 422, for example. The BPC 424 is transmitted by providing a falling edge 428 on SDATA 404 while SCLK 402 is in a high signaling state 430. By protocol, transitions on SDATA 404 during transmission of the datagram 422 are permitted only while the clock signal is in the low signaling state, and the falling edge 428 that occurs while SCLK 402 is in the high signaling state 430 is interpreted as control signaling (i.e., the BPC 424). The falling edge 428 is provided by the bus master driving SDATA 404 low at full strength. The bus master then drives SCLK 402 low and continues to drive SCLK 402 at full strength through subsequent bus idle intervals 426, 436. After driving SCLK 402 low, the bus master initiates a bus idle interval 436 at a time 432 when the bus master causes its line driver to enter the high impedance state. While no other device is driving SDATA 404, SDATA 404 remains in the weakly driven low signaling state 434. The BPC 424 is terminated and the serial bus enters a bus idle interval 426 until the next datagram is ready for transmission.

Figure 5:
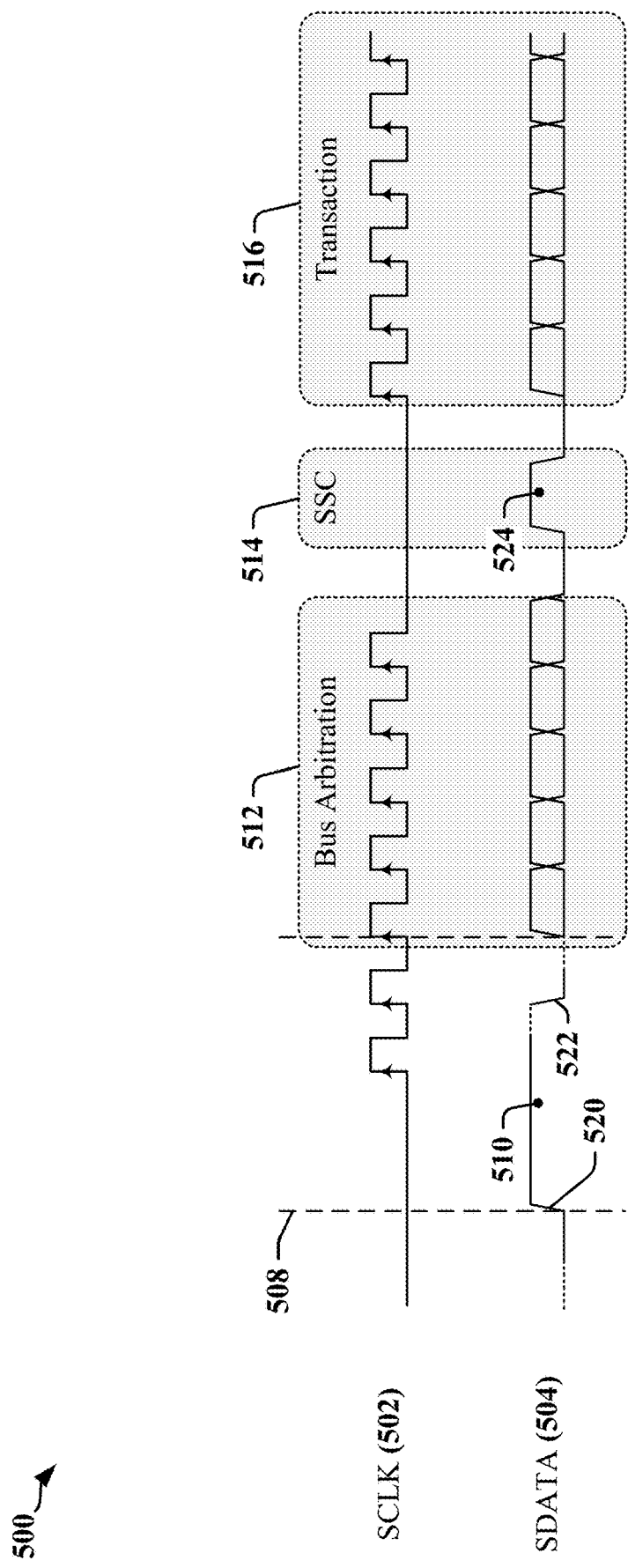
FIG. 5 illustrates certain aspects related to the timing of an RFFE transaction executed through a data communication link.

FIG. 5 illustrates certain aspects related to the timing of an RFFE transaction 500 executed through a data communication link. The transaction 500 commences at a time 508 with a bus arbitration procedure 512 in which an initiating device indicates a desire to write or read data over the data communication link by driving SDATA 504. The bus arbitration procedure 512 is performed to determine the highest-priority device seeking to use the data communication link. Device priority may be determined based on a device identifier and the highest-priority device participating in the bus arbitration procedure 512 is generally granted control of the data communication link. Initially, SDATA 504 is weakly driven by the bus master or is held in the weakly driven low signaling state using a keeper circuit or a weak pull-down circuit. A keeper circuit or a weak pull-down circuit may maintain the signaling state of SDATA 504, for example, when the bus master has caused its line driver to enter a high impedance state and when no other device is driving SDATA 504. The weakly driven low signaling state can easily be overcome by another line driver that can drive SDATA 504 at full strength.

At a point in time 508, the initiating device initiates a first pulse 510 on SDATA 504. Consistent with RFFE protocols, the current bus master provides a clock signal on SCLK 502 after detecting the rising edge 520, and the initiating device releases SDATA 504 during the first clock cycle. The bus master then drives SDATA 504 to provide the falling edge 522 of the first pulse 510 before configuring its line driver for high impedance mode and causing SDATA 504 to reenter the weakly driven low signaling state. Devices seeking control of the data communication link then attempt to transmit their respective addresses. Upon detecting a higher-priority address, a participating device withdraws from the bus arbitration procedure 512. A device that succeeds in transmitting its entire address wins the bus arbitration procedure 512. In the illustrated example, a Sequence Start Condition (the SSC 514) is transmitted after completion of the bus arbitration procedure 512 to commence a transaction 516 involving the winning device. According to some protocols, the winning device may control the transaction 516 and provides the SSC 514 by transmitting a second pulse 524 on the SDATA 504 while the clock signal on SCLK 502 is held in a low signaling state.

In response to continual demands for increased performance and capabilities, wireless communication devices continue to provide greater functionality using increasing numbers of RF interfaces, which has led to increasing complexity of circuits. The physical size of IC circuits has been decreasing as newer process technologies are introduced to satisfy demands for higher operating frequencies. The decreasing size of IC devices and increasing number of RF Front-End circuits and other types of interface creates an insatiable demand for input/output (I/O) pins used to interconnect IC devices. It is often desirable to reduce serial buses to one-wire operation by eliminating transmission of clock signals between devices coupled to the serial buses. In the example of RF front-end devices, the elimination of the clock line can be difficult to achieve without compromising data throughput.

Conventional one-wire interfaces typically operate at limited speed with throughputs in the range of 32 kHz to 4 MHz. These one-wire interfaces may transmit data without any clock information or may transmit data with embedded clock information using techniques that limit available data rates or size of transactions. For example, a derived receive clock signal may lose synchronization with the transmitter clock after some quantity of clock cycles due to phase shifts, frequency mismatch, noise and other interferences.

In one example, a simple interface based on UARTs does not use a separate clock line and does not embed clock information in transmitted data. Transmit and receive sides depend on an a-priori knowledge of the bitrate and use local oversampling clocks for encoding and decoding data bits. Due to inherent clock phase and frequency mismatch between the two sides, this approach is limited in speed and imposes limitations on the number of bits that can be packaged between start and stop bit intervals.

Limitations on throughput may be ameliorated through the use of a clock generation circuit that employs a delay locked loop (DLL), phase locked loop (PLL) or synchronizing circuits. However, these synchronizing circuits tend to be overly complex and power hungry for many mobile communication applications, which require a clock generation circuit that consumes no more than 1-2 uA in stand-by mode, and that can transition from standby mode to stabile, full-rate mode with a delay of no more than 150 ns. Conventional clock generator circuits that meet these criteria are not available for use in a mobile communication device.

Certain aspects disclosed herein relate to a low-cost, low-complexity clock generator circuit that employs robust phase synchronization to derive a receive clock for high-speed serial bus operation. The presently disclosed clock generator circuit can be used to implement a one-wire serial bus based on I2C, I3C, SPI, SPMI, RFFE or other standards-defined or proprietary protocols. Full, high speed data rates can be accomplished without the use of a separate clock line. The presently disclosed clock generator circuit can ensure high degrees of robustness (BER of $10^{-9}$ or lower) under very high clock variation from nominal frequencies (+/−5 to 15%). The presently disclosed clock generator circuit can minimize power consumption and occupation of IC die area.

In accordance with certain aspects disclosed herein, the protocol used for controlling operation of the one-wire serial bus may be adapted from a protocol defined for two-wire operation. Certain aspects of a serial multidrop protocol selected to control and manage transmissions over the 1-wire serial bus may be adapted, configured or modified to support arbitration, line turnaround and transmissions executed without an explicit clock reference such as a clock signal transmitted on a dedicated clock wire.

In the various examples provided herein, the example of a 1-wire serial bus is described in which data and commands are configured in accordance with an RFFE protocol. However, the concepts are not limited to RFFE protocols and various aspects of this disclosure apply equally to I2C, I3C, SPI, SPMI and other standards-defined or proprietary protocols. The single line of the one-wire serial bus is used as a data line for bidirectional transmission of control and data signaling. According to certain aspects of this disclosure timing for communication between one-wire slave devices coupled to the serial bus may be embedded in data transmissions and control signaling may be provided to synchronize clock signals at the transmitter and receiver.

Figure 6:
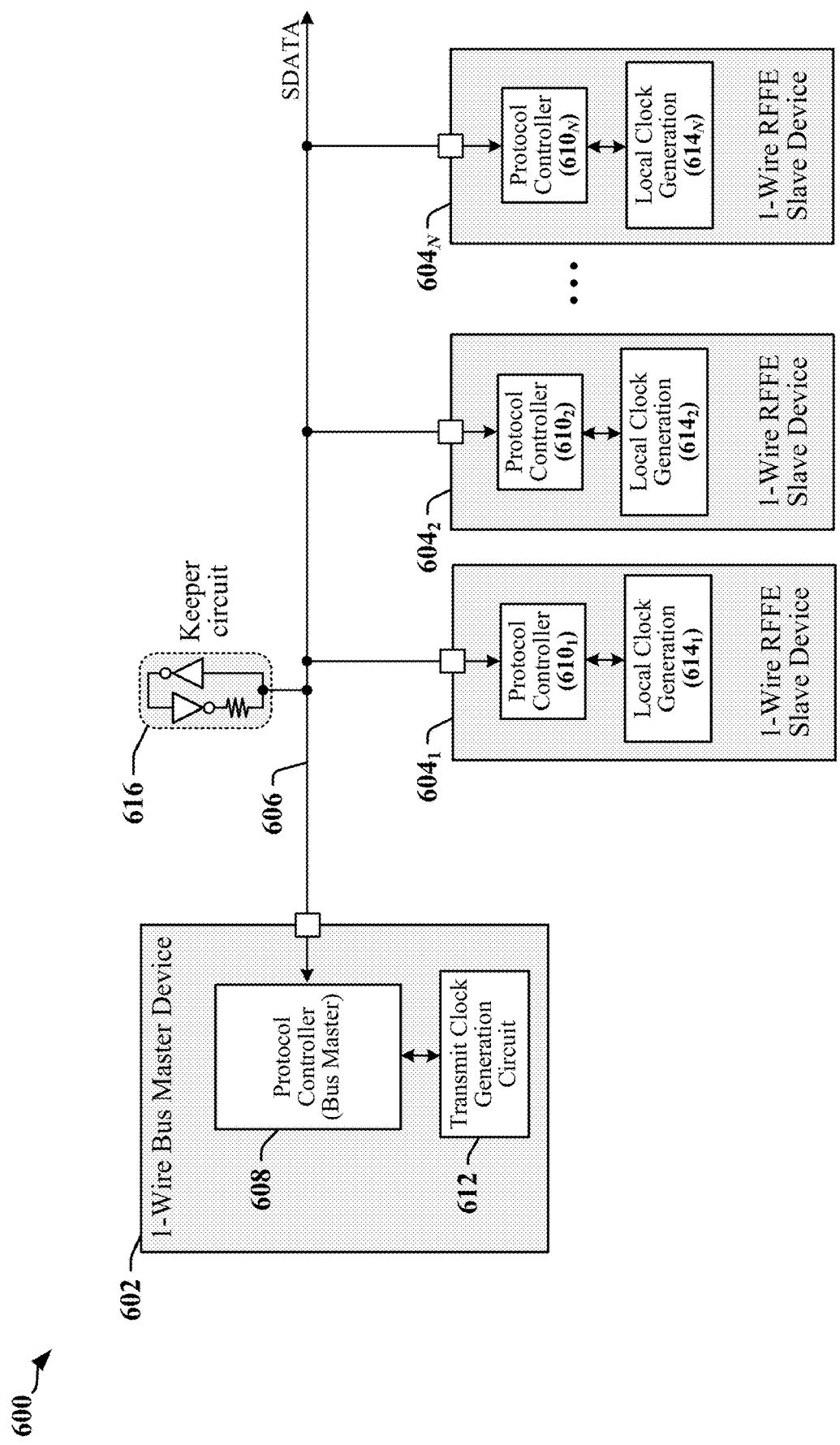
FIG. 6 illustrates a system in which a bus master device communicates with one or more one-wire slave devices in accordance with certain aspects disclosed herein.

FIG. 6 illustrates a system 600 in which a bus master device 602 communicates with one or more one-wire slave devices 604$_1$-604$_N$ in accordance with certain aspects disclosed herein. The bus master device 602 may be provided in an RFIC, modem, application processor or another type of device. The bus master device 602 may be adapted to exchange data with the one-wire slave devices 604$_1$-604$_N$ over a single wire, referred to as the SDATA line 606 in the illustrated system 600. Data is encoded in a signal transmitted over the SDATA line 606, where the signal includes embedded clock information that can be used by the receiving device to decode data from the signal.

The bus master device 602 and the one-wire slave devices 604$_1$-604$_N$ typically include respective protocol controllers 608, 610$_1$-610$_N$. The protocol controllers 608, 610$_1$-610$_N$ may include a processor, controller, state machine or other logic circuits configured to support one or more protocols. The protocol controller 608 in the bus master device 602 may be further configured to manage communication over the SDATA line 606. In some instances, the protocol controller 608 performs some of the functions of a bus master. In some implementations, the protocol controller 608 in the bus master device 602 may be used to configure one or more of the one-wire slave devices $604_1$-$604_N$. The bus master device 602 may determine a configuration of a one-wire slave device $604_1$-$604_N$ that is a designated recipient of data to be transmitted over the SDATA line 606, and may cause the protocol controller 608 to encode data intended for the recipient one-wire slave device $604_1$-$604_N$ in a signal to be transmitted over the SDATA line 606 and addressed to the one-wire slave device $604_1$-$604_N$.

The bus master device 602 may include a transmit clock generator 612 that can be used to define timing for transmissions over the SDATA line 606. Each of the one-wire slave devices $604_1$-$604_N$ includes a local clock generation circuit $614_1$-$614_N$ that provides timing for the corresponding protocol controller $610_1$-$610_N$. The local clock generation circuits $614_1$-$614_N$ may be synchronized using synchronization pulses transmitted by the bus master device 602 after an SSC or transmitted by the bus master device 602 or by one of the one-wire slave devices $604_1$-$604_N$ after a line turnaround. In accordance with certain aspects of this disclosure, the local clock generation circuits $614_1$-$614_N$ may be synchronized using transitions in Manchester-encoded commands and data payloads transmitted over the SDATA line 606. The local clock generation circuits $614_1$-$614_N$ may include a ring oscillator or delay locked loop. In some implementations, the local clock generation circuits $614_1$-$614_N$ includes an injection-locked oscillator that responds to synchronizing pulses and/or the transitions in Manchester-encoded command and data payload transmissions.

A keeper circuit 616 may be coupled to the SDATA line 606 to facilitate line turnaround, in-band interrupt requests or arbitration procedures in accordance with certain aspects disclosed herein. In one example, the keeper circuit 616 may be configured as a positive feedback circuit that drives the SDATA line 606 through a high impedance output, and receives feedback from the SDATA line 606 through a low impedance input. The keeper circuit 616 may be configured to maintain the last asserted signaling state or voltage on the SDATA line 606. The keeper circuit 616 can be easily overcome by an active line driver in the bus master device 602 or in one of the one-wire slave devices $604_1$-$604_N$.

Conventional implementations of 1-wire bidirectional communication buses have been hampered by restrictively slow data rates. Many conventional 1-wire bidirectional communication buses are limited to sub-megahertz (MHz) signaling rates and are unsuited to high-speed RF-Front End control applications which can require clock rates of 52 MHz or more. Some conventional 1-wire bidirectional communication buses attempt to increase data rates through the use of pulse-width modulation and other data encoding schemes. However, these latter communication buses are typically unable to obtain signaling rates greater than 4 MHz due to various limitations with PWM signaling, for example.

A 1-wire bidirectional communication bus implemented in accordance with certain aspects of this disclosure can achieve data rates of at least 52 MHz. In certain examples, a signaling scheme provided for communication over 1-wire communication buses uses a combination of RFFE protocols, Manchester encoding and modified control signaling that can indicate and distinguish between various types of transactions.

In accordance with certain aspects of this disclosure, clock phase and frequency synchronization at the receiver coupled to a one-wire serial bus is acquired and maintained through the use of Manchester encoding. Manchester encoding embeds clock information in every bit transmitted over the one-wire serial bus by mandating that each bit includes a transition at the middle of the bit transmission interval. According to one aspect of this disclosure, a receive clock signal can be resynchronized for every bit of the Manchester-encoded received in a data stream. Synchronization enforced at the rate of bit transmission can eliminate cumulative effects of phase and frequency variations, and can ensure error-free data recovery with unlimited data-frame length.

In one aspect, higher power efficiencies can be achieved through the use of Manchester encoding. State transitions of the interface may be detected and used to disable or enable an oscillator in the receive clock generation circuit. For example, the oscillator may be enabled upon detection of a start of frame (SoF) and may be disabled upon detection of an end of frame (EoF), thereby conserving energy by avoiding the need for an always-on, free-running oscillator.

In certain implementations, a clock stability latency interval may be defined or configured to define the delay between transmission of an SoF and first data bits. A programmable clock stability latency interval may be configured and/or calibrated to minimize delay imposed while phase synchronization of the receive clock is achieved.

In certain implementations, one or more programmable clock phase synchronization (CPS) pulses may be transmitted to serve as edge sensitive phase synchronization triggers. In one example, CPS pulses are transmitted after transmission of an SoF and before transmission of data bits. In another example, the first-transmitted CPS pulse serves as an SoF and may be followed by one or more additional CPS pulses that precede transmission of data bits. In some instances, each CPS pulse is transmitted in a single clock cycle and both edges of the pulse are used for synchronization. In some instances, each CPS pulse is transmitted in two clock cycles and one edge of the pulse is used for synchronization.

In certain implementations, the receive clock generation circuit is a bit-rate sensitive stand-alone clock and may be programmed or configured. In one example, the receive clock generation circuit may be enabled or disabled based on the state of the one-wire serial bus. In some instances, an out-of-loop control circuit may be used to configure the frequency of the receive clock generation circuit. Frequency control may be implemented to accommodate variable operating conditions, including conditions affected by Process, Voltage Temperature (PVT) variations or corners.

In one example, the receive clock generation circuit includes a chain of flipflops configured as a clock divider. One or more flipflops in the chain of flipflops may be configured to define edge triggering modes, reset or preload values and options, and clock gating functions. The chain of flipflops may be configured to reduce frequency of an output clock signal through integer division of an input or primary clock signal. The chain of flipflops may be configured to control duty cycle and phase of its output clock signal.

Figure 7:
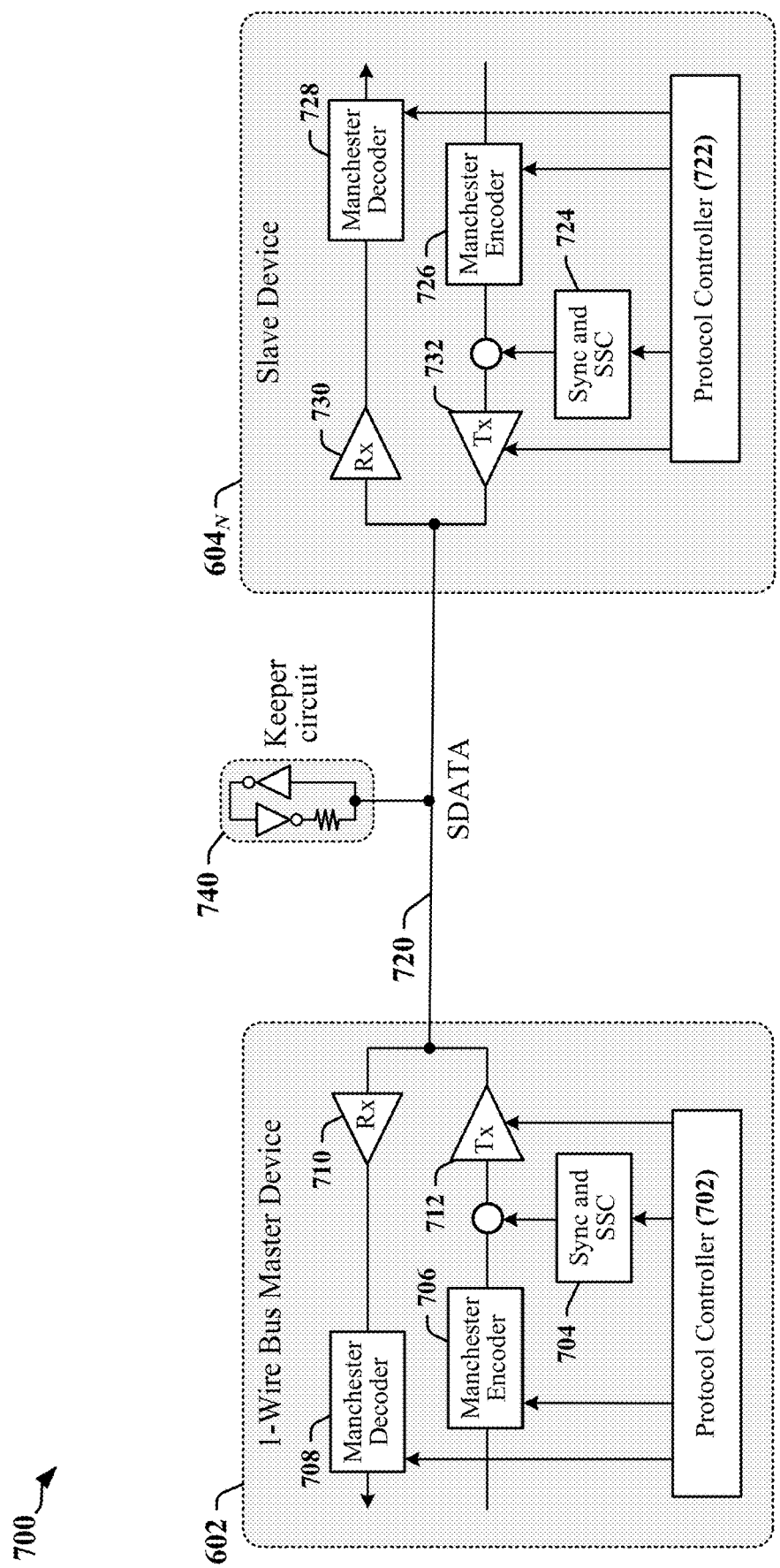
FIG. 7 illustrates an example of a 1-wire serial interface that may be configured in accordance with certain aspects of this disclosure.

FIG. 7 illustrates an example of a 1-wire serial interface 700 that may be configured in accordance with certain aspects of this disclosure. In the example, a bus master device 602 and one-wire slave device $604_N$ (see FIG. 6) are illustrated. The bus master device 602 includes a protocol controller 702. The protocol controller 702 may be implemented using a processor, microcontroller or finite state machine and may be used to control transmit and receive functions of the bus master device 602. The protocol controller 702 may include or be coupled to a signal generation circuit 704 that generates synchronization and SSC signals transmitted on the SDATA line 720 that couples the bus master device 602 to one or more slave devices 604$_N$. The signal generation circuit 704 may be configured to generate different types of SSC to initiate arbitration, initiate data transfer or to abandon arbitration. The signal generation circuit 704 may be configured to generate synchronization pulses used to synchronize clock signals produced at the slave devices 604$_N$ with a transmit clock signal generated in the bus master device 602.

The protocol controller 702 may be configured to selectively activate a Manchester encoder 706 and a Manchester decoder 708 based on mode of operation of the 1-wire serial interface 700. The Manchester decoder 708 may extract data and clock information from a signal received from the SDATA line 720. The protocol controller 702 may be further configured to format datagrams for transmission over the SDATA line 720. The protocol controller 702 may be further configured to generate commands to be transmitted over the SDATA line 720.

In the illustrated example, the one-wire slave device 604$_N$ includes a protocol controller 722. The protocol controller 722 may be implemented using a processor, microcontroller or finite state machine and may be used to control transmit and receive functions of the one-wire slave device 604$_N$. The protocol controller 722 may include or be coupled to a signal generation circuit 724 that generates synchronization pulses to be transmitted when the one-wire slave device 604$_N$ is transmitting over the SDATA line 720. The protocol controller 722 may be further configured to cause the signal generation circuit 724 to drive the SDATA line 720 to initiate an SSC in an in-band interrupt procedure and may be further configured to cause the signal generation circuit 724 to drive the SDATA line during an arbitration procedure. The synchronization pulses generated by the signal generation circuit 704 may be configured to synchronize clock signals produced at the bus master device 602 with a transmit clock signal generated in the slave device 604$_N$.

The protocol controller 722 may be configured to selectively activate a Manchester encoder 726 and a Manchester decoder 728 based on mode of operation of the 1-wire serial interface 700. The Manchester decoder 728 may extract data and clock information from a signal received from the SDATA line 720. The protocol controller 722 may be further configured to format datagrams for transmission over the SDATA line 720. The protocol controller 722 may be further configured to disassemble datagrams and/or respond to commands received from the SDATA line 720.

The protocol controller 702 may be configured to manage and control the operation of a line driver 712 and a line receiver 710. The protocol controller 722 may be configured to manage and control the operation of a line driver 732 and a line receiver 730. The line drivers 712, 732 may present a high impedance to the SDATA line 720 when inactivated or disabled. For example, the output of the line driver 712 in the bus master device 602 may present a high impedance to the SDATA line 720 when the one-wire slave device 604$_N$ is configured or expected to transmit data or control signals over the SDATA line 720. The output of the line driver 732 in the one-wire slave device 604$_N$ is typically in the high impedance state when the bus master device 602 is driving the SDATA line 720.

A keeper circuit 740 coupled to the SDATA line 720 facilitates line turnaround, in-band interrupt requests and arbitration procedures in a bidirectional 1-wire serial bus. It is often desired to maintain the state of the SDATA line 720 when all devices are in high impedance mode, during line turnarounds or in arbitration procedures. Line turnaround occurs when the bus master device 602 transitions from transmitting to receiving or from receiving to transmitting. During arbitration procedures, the bus master device 602 may enter high impedance mode when the one-wire slave device 604$_N$ has the option to transmit and the line driver in the bus master device 602 may present a high impedance to the SDATA line 720 to avoid contention. The state of the SDATA line 720 may be maintained using the keeper circuit 740. In one example, the keeper circuit 740 may be configured as a positive feedback circuit that drives the SDATA line 720 through a high impedance output, and receives feedback from the SDATA line 720 through a low impedance input. The keeper circuit 740 may be configured to maintain the last asserted voltage on the SDATA line 720. The keeper circuit 740 can be easily overcome by the line drivers 712, 732 in the bus master device 602 and the one-wire slave device 604$_N$, respectively.

Figure 8:
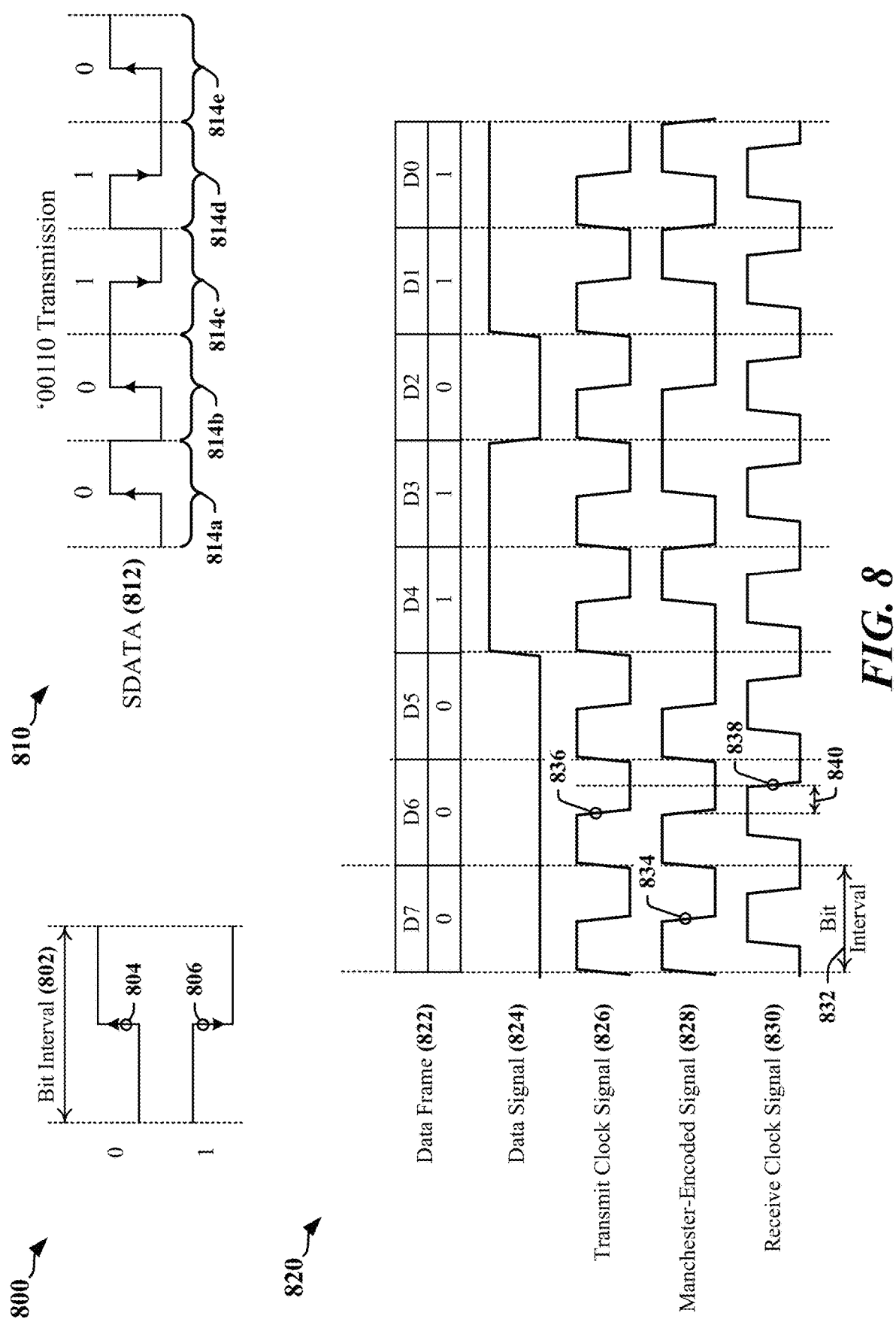
FIG. 8 illustrates certain aspects of Manchester encoding and control signaling that may be used to exchange data between a bus master device and one-wire slave devices in accordance with certain aspects of this disclosure.

FIG. 8 illustrates certain aspects of Manchester encoding and the control signaling that may be used to exchange data between the bus master device 602 and the one-wire slave devices 604$_1$-604$_N$ over the SDATA line 606 (see FIG. 6) in accordance with certain aspects of this disclosure. As shown in the first timing diagram 800, Manchester encoding encodes data based on the direction of a transition occurring in the middle of a bit transmission interval 802. For example, a signal wire may be in a low state initially and a transition 804 to the high state indicates a '0' value bit. The signal wire may initially be in a high state and a transition 806 to the low state indicates a '1' value bit. Clock information is embedded in the data signal in the transitions that occur within every bit transmission interval 802.

The second timing diagram 810 illustrates five bit transmission intervals 814*a*-814*e* in a signal carried on SDATA 812. A sequence of bits {0, 0, 1, 1, 0} is transmitted in the five bit transmission intervals 814*a*-814*e* and illustrates the transitions within each of the five bit transmission intervals 814*a*-814*e*. It will be observed that transitions may occur at some boundaries between bit transmission intervals 814*a*-814*e* and that no transitions occur at the other boundaries between bit transmission intervals 814*a*-814*e*.

The third timing diagram 820 illustrates certain aspects of timing related to the transmission of an 8-bit data frame 822 over the one-wire serial bus. The data frame 822 may be serialized and provided to a Manchester encoder in a data signal 824. In some implementations, the Manchester encoder receives parallel data for encoding, or accesses data frames stored in a transmit buffer. The Manchester encoder may encode the data in accordance with timing provided by a transmit clock signal 826. In one example, the frequency of the transmit clock signal 826 may be 52 MHz. The Manchester encoder generates a Manchester-encoded signal 828 for transmission over the one-wire serial bus.

At the receiving device, the Manchester-encoded signal 828 is provided to a Manchester decoder. The Manchester decoder may include or be coupled to a clock generation circuit that is configured to generate a receive clock signal 830 to be used to decode data from the Manchester-encoded signal 828. The clock generation circuit may include one or more oscillators, one or more frequency dividers and a phase synchronization circuit. The phase synchronization circuit may be configured to synchronize the receive clock signal 830 based on timing information derived from the Manchester-encoded signal 828. The timing information includes transitions 834 Manchester-encoded signal 828 at the center of each bit transmission interval 832.

In the illustrated example, each falling edge 838 in the receive clock signal 830 is delayed with respect the corresponding falling edge 836 in the transmit clock signal 826. The delay 840 between the associated falling edges 836, 838 may be configured to provide sufficient setup and hold times for sampling circuits in the receiver device. The delay 840 between the associated falling edges 836, 838 may be configured to provide a tolerance for phase offsets between the transmit clock signal 826 and receive clock signal 830, including transitory phase offsets resulting from noise affecting the one-wire serial bus and phases caused by loss of synchronization or imperfect synchronization.

According to certain aspects of this disclosure, a one-wire serial bus may be configured, managed, controlled and/or monitored in accordance with a standards-defined or proprietary protocol. For the purposes of this description, the example of an RFFE protocol will be illustrated. However, the concepts are not limited to RFFE protocols and various aspects of this disclosure apply equally to I2C, I3C, SPI, SPMI and other standards-defined or proprietary protocols. For example, other protocols employ or can be adapted to use similar arbitration schemes, SoF and EoF signaling, command structure and datagram or data frame configurations. In some instances, a protocol defined for use with a two-wire serial bus may be adapted to implement features such as line-turnaround that are used to control the one-wire serial bus.

Figure 9:
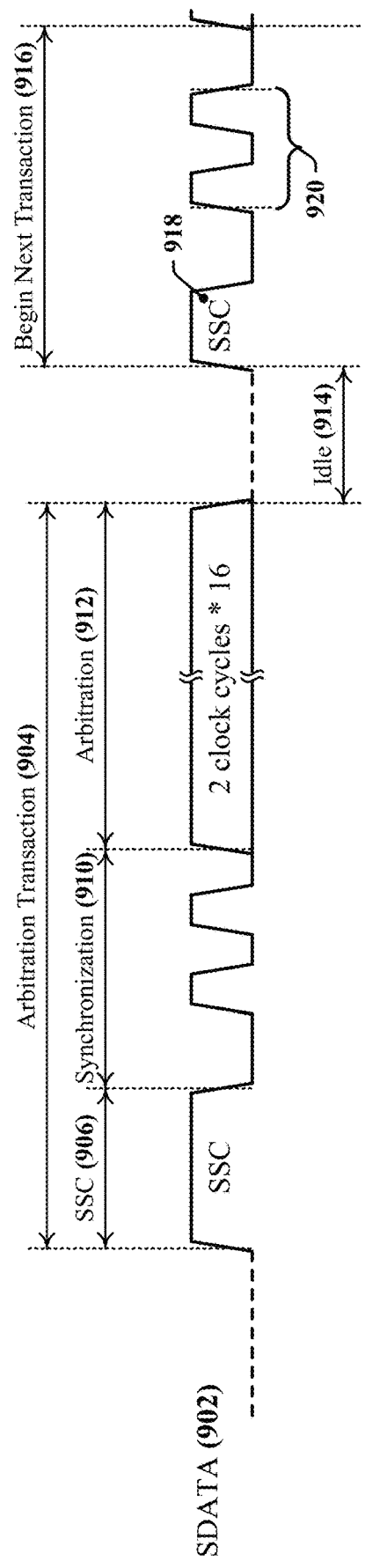
FIG. 9 includes a timing diagram that illustrates an arbitration transaction conducted on a 1-wire serial bus configured or adapted in accordance with certain aspects of the disclosure.

FIG. 9 includes a timing diagram 900 that illustrates an arbitration transaction 904 conducted on a 1-wire serial bus configured or adapted in accordance with certain aspects of the disclosure. The 1-wire serial bus has an interconnect or wire (SDATA 902) configured for carrying bidirectional data between two or more devices. A bus master device manages operation of the 1-wire serial bus by providing control signaling that can indicate, for example, start of a datagram, end of the datagram, start of an interruptible transaction, and abandonment of an interrupt processing (arbitration) procedure. The bus master device also employs signaling and encoding techniques configured to enable clock synchronization at the slave devices, and to enable data exchange during read and write operations. In one example, control signaling based on SSC length can be used to accommodate interrupts, and/or to abandon interrupt signaling in order to support processing of newly received higher priority messages.

In the illustrated example, the duration of an SSC 906 may be controlled by the bus master device. Initially, SDATA 902 is in an idle state, weakly driven low by the bus master or is held in the weakly driven low signaling state using, for example, the keeper circuit 616 or 740 illustrated in FIG. 6 and FIG. 7, or a weak pull-down circuit. A keeper circuit or a weak pull-down circuit may maintain the signaling state of SDATA 902, for example, when the bus master device has caused its line driver to enter a high impedance state and when no other device is driving SDATA 902. The weakly driven low signaling state can easily be overcome by an active line driver that can drive SDATA 902 at full strength, such as the line driver 712 in the bus master device 602 or the line driver 732 in one of the one-wire slave device $604_N$.

The bus master device may initiate the SSC 906 or one or more slave devices may drive SDATA 902 to initiate the SSC 906 during a bus idle period by driving SDATA 902 high. In instances where the SSC 906 is initiated by a slave device, the slave device may initiate the SSC 906 after SDATA 902 has been idled for a minimum period of time defined by protocol and/or preconfigured during system initialization. The slave device is expected to release SDATA 902 by causing its line driver coupled to SDATA 902 to present a high impedance to SDATA 902 within one clock cycle of an internally generated clock signal. The signaling of SDATA 902 may be maintained by a keeper circuit after the line driver in the slave device has entered high impedance mode. The bus master is configured to activate its line driver coupled to SDATA 902 after approximately one clock cycle of its transmit clock signal. The bus master device may terminate the SSC 906 by driving SDATA 902 low to indicate a type of transaction to be performed. In some examples, the bus master device terminates the SSC 906 after two cycles of the transmit clock in order to indicate that no bus arbitration procedure is to be performed, and/or to indicate that a read or write transaction is to be initiated by the bus master device. The arbitration procedure may be suppressed when, for example, the bus master device determines that a higher priority message is available for transmission, when the bus master device determines that the arbitration procedure or subsequent transmission of a datagram would interfere with a scheduled message or command, or for other reasons defined by application or system configuration. In the illustrated example, the bus master device terminates the SSC 906 after 4 cycles of the transmit clock, indicating that an arbitration procedure is to be performed.

The bus master device may transmit one or more synchronization pulses after terminating the SSC 906. The number of synchronization pulses transmitted may be selected based on capabilities of the receiving device. In the illustrated example, the bus master device transmits two synchronization pulses 910 after terminating the SSC 906. The synchronization pulses 910 can be used by the receiving device to synchronize a local clock generation circuit. In one example, the local clock generation circuit includes a ring oscillator. In another example, the local clock generation circuit includes a delay locked loop. The clock pulses may be provided to an injection locking circuit of the local clock generation circuit. The number of pulses in the synchronization pulses 910 may be configured during manufacture, system integration or configuration and/or by an application or bus master device.

The synchronization pulses 910 may precede an arbitration period 912. In some instances, the arbitration period 912 provides a two-cycle slot for each slave address registered at the bus master or coupled to the 1-wire serial bus. In one example, the arbitration period 912 accommodates 8 devices and has a duration of 16 cycles of the transmit clock used by the bus master device. The bus master device may cause its line driver to enter a high impedance state at the beginning of each slot in the arbitration period 912 and the signaling state of SDATA 902 is maintained by the keeper circuit or weak pull-down circuit until a line driver coupled to SDATA 902 begins to actively drive SDATA 902.

A slave device can participate in the bus arbitration by driving SDATA 902 high during the first cycle of its corresponding slot in the arbitration period 912. The participating slave device then causes its line driver to enter a high impedance state before the end of the first cycle of the slot. SDATA 902 remains in the high state due to the operation of a keeper circuit or due to the bus master device activating its line driver to maintain SDATA 902 in the high state for the complete first cycle. The bus master device drives SDATA 902 low in the second cycle of the slot to permit the next slave device to unambiguously signal participation in arbitration. The bus master device identifies each device that drove SDATA 902 high during its corresponding slot in the arbitration period 912 as a device seeking service. The bus master device may then schedule servicing of the participant slave devices in an order determined by priority or sequence configured for the system. In the event that the bus master device abandons the arbitration process by transmitting an 8-cycle SSC, the bus master device can retain the information identifying participant slave devices in the arbitration period 912 and may schedule servicing based on the identifying information.

The bus master device may idle SDATA 902 for a period of time 914 after the arbitration period 912 and before initiating a next transaction 916. SDATA 902 may be idled when the bus master device causes its line driver to enter a high impedance state. In the illustrated example, the next transaction 916 commences with a 2-cycle SSC 918 to indicate that arbitration is not enabled. The transaction 916 continues with transmission of synchronization pulses 920 that can be used by the receiving device to synchronize its local clock generation circuit.

According to certain aspects of the disclosure, control signaling provided by the bus master device can indicate start of a datagram, end of the datagram, start of an interruptible transaction, and abandonment of an interrupt processing procedure. The datagram may also be referred to as a frame or may be provided within a frame that includes arbitration or other datagrams. The control signaling provided by the bus master device can indicate start of frame (SoF) or end of frame (EoF). Signaling and encoding techniques can be configured to enable clock synchronization, and data exchange for both read and write operations. Control signaling based on SSC length can be used to accommodate interrupts as an integrated support feature of the bus architecture, and to abandon interrupt signaling in order to support processing of newly received higher priority messages.

Figure 10:
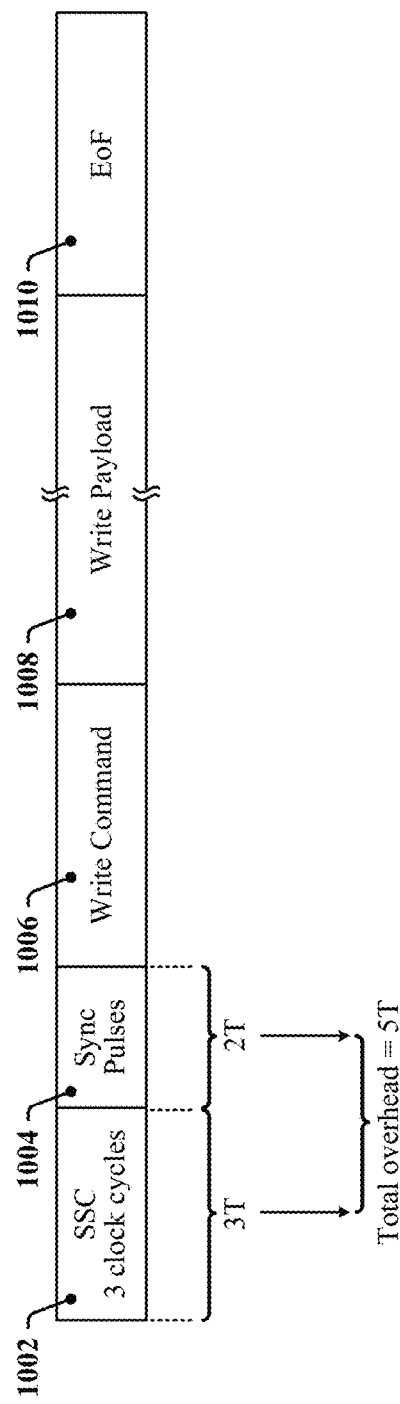
FIG. 10 illustrates a write transaction executed on a 1-wire serial bus configured in accordance with certain aspects disclosed herein.

FIG. 10 illustrates a write transaction 1000 executed on a 1-wire serial bus configured in accordance with certain aspects disclosed herein. The write transaction 1000 may commence with the transmission of an SSC 1002. In the illustrated example, the SSC 1002 has a duration of three transmit clock cycles. In some implementations, an arbitration may optionally follow the SSC 1002. The write transaction 1000 continues with transmission of synchronization pulses 1004 that can be used by the receiving device to synchronize its local clock generation circuit. A write command 1006 is transmitted. The write command 1006 may have a structure and content compatible or compliant with one or more commands defined by RFFE protocols. The write command 1006 may be encoded using Manchester encoding. The bus master device then transmits a payload 1008 that is directed to a device identified in the write command 1006. The payload 1008 may be encoded using Manchester encoding. The write transaction 1000 is terminated by an EoF 1010. In some instances, the EoF 1010 may be indicated by SDATA being idle for a number of cycles. In one example, the EoF 1010 is indicated when SDATA is idle for 7 cycles of the transmit clock.

The illustrated write transaction 1000 includes additional overhead with respect to a corresponding write transaction conducted over a conventional 2-wire serial bus operated in accordance with RFFE protocols. The additional overhead can be attributed to transmission of the synchronization pulses 1004 and the EoF 1010. In the illustrated example, the additional overhead associated with the SSC 1002 and synchronization pulses 1004 may be calculated as 5 cycles of the transmit clock. Additional overhead may be attributed to the transmission of the EoF 1010.

Figure 11:
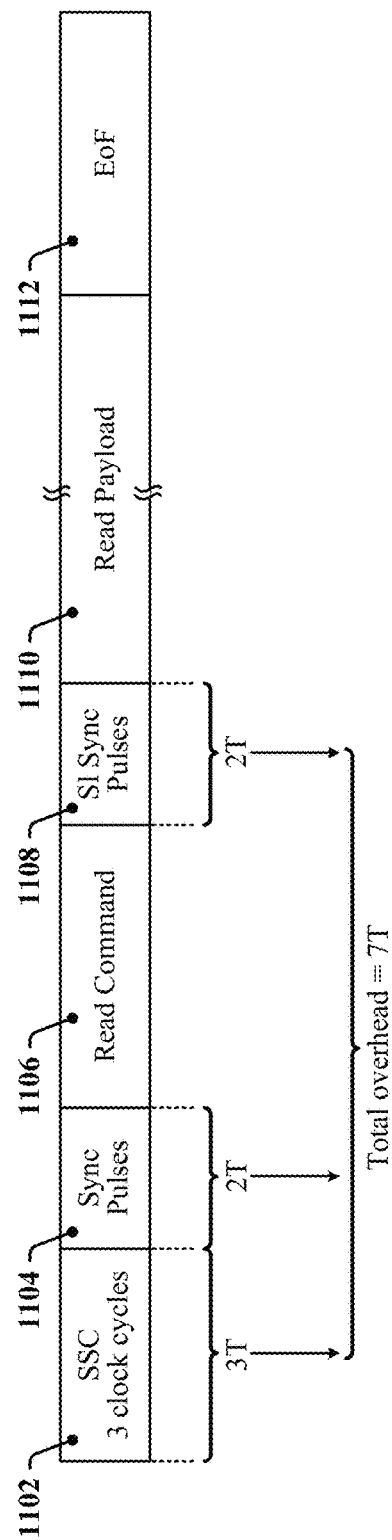
FIG. 11 illustrates a read transaction executed on a 1-wire serial bus configured in accordance with certain aspects disclosed herein.

FIG. 11 illustrates a read transaction 1100 executed on a 1-wire serial bus configured in accordance with certain aspects disclosed herein. The read transaction 1100 may commence with the transmission of an SSC 1102. In the illustrated example, the SSC 1102 has a duration of three transmit clock cycles. The read transaction 1100 continues with transmission of synchronization pulses 1104 that can be used by the receiving device to synchronize its local clock generation circuit. A read command 1106 is transmitted. The read command 1106 may have a structure and content compatible or compliant with one or more commands defined by RFFE protocols. The read command 1106 may be encoded using Manchester encoding.

The bus master device provides a turnaround period during which the bus master device causes its line driver to enter a high impedance state and the slave device addressed by the read command 1106 activates its line driver. The bus master is configured to disable its line driver in and the addressed slave device enables its line driver. The slave device transmits synchronization pulses 1108 that can be used by the bus master device to synchronize its receive clock generation circuit. In one example, the slave device uses two cycles of its transmit clock signal to transmit the synchronization pulses 1108. The slave device then transmits a payload 1110. The payload 1110 may be encoded using Manchester encoding. The read transaction 1100 is terminated by an EoF 1112. In some instances, the EoF 1112 may be indicated by SDATA being idle for a number of cycles. In one example, the EoF 1112 is indicated when SDATA is idle for 7 cycles of the transmit clock.

The illustrated read transaction 1100 includes additional overhead with respect to a corresponding read transaction conducted over a conventional 2-wire serial bus operated in accordance with RFFE protocols. The additional overhead can be attributed to transmission of the SSC 1102, synchronization pulses 1104, 1108 and the EoF 1112. In the illustrated example, the additional overhead associated with the SSC 1102, synchronization pulses 1104 may be calculated as 7 cycles of the transmit clock.

Figure 12:
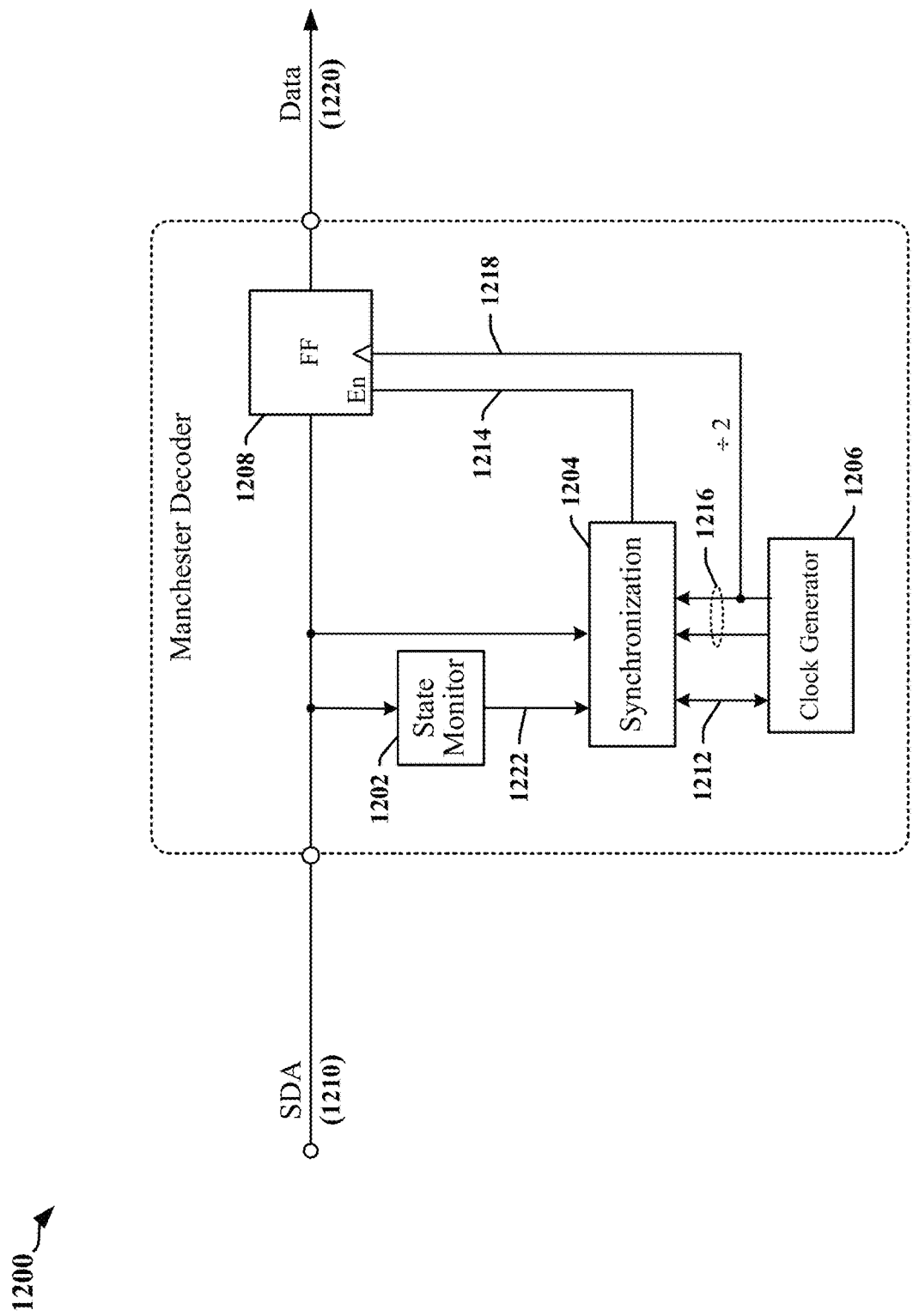
FIG. 12 illustrates a Manchester decoder that can be configured in accordance with certain aspects disclosed herein.

FIG. 12 illustrates a Manchester decoder 1200 that can be configured in accordance with certain aspects disclosed herein. The Manchester decoder 1200 is coupled to SDA 1210 (the one-wire serial bus) and may be operative to produce an output 1220 representative of data encoded in a signal transmitted over SDA 1210.

The Manchester decoder 1200 includes a clock generator 1206 that is configurable to provide multiple clock signals 1216. The clock generator 1206 may include or be coupled to a programmable oscillator. In one example, the programmable oscillator can be configured to produce a base clock signal that has a frequency four times (4×) higher than the frequency of the clock signal used by a transmitter to encode data for transmission over SDA 1210. In some implementations, the programmable oscillator may be implemented using a programmable ring oscillator circuit. The clock generator 1206 may include frequency dividers, delay circuits, phase shifters, inverters and other circuits that can modify frequency or phase of a clock signal. In the illustrated example, the clock generator 1206 outputs one or more clock signals 1216, including a sampling signal 1218 that is half the frequency of the base clock signal and double the frequency of the clock signal used by the transmitter during encoding. The sampling signal 1218 clocks a flipflop 1208 coupled to SDA 1210, such that the flipflop can capture data from SDA 1210 when enabled.

The frequency and phase of the clock signals 1216 may be controlled using a synchronization circuit 1204. The synchronization circuit 1204 may be configured to align edges in the clock signals 1216 with transitions in SDA 1210. The synchronization circuit 1204 may configure a control signal 1214 to enable and disable the flipflop 1208 based on current state of the Manchester decoder 1200. The synchronization circuit 1204 may be configured to enable and disable the oscillator in the clock generator 1206 based on current state of SDA 1210. In one example, a state monitor circuit 1202 determines when an SoF has been received, when SDA 1210 is active and carrying a data signal, and when an EoF has been received. The synchronization circuit 1204 may be configured to enable the oscillator responsive to a control signal 1222 received from the state monitor circuit 1202 indicating detection of the SoF, cause the clock signals 1216 to be frequency and phase aligned during transmission of synchronization pulses and continuously adjust frequency and phase synchronize the clock signals 1216 using edges detected in a data signal received from SDA 1210 during active transmission. In some implementations, the synchronization circuit 1204 uses control and status signals 1212 to manage operation of the clock generator 1206.

Figure 13:
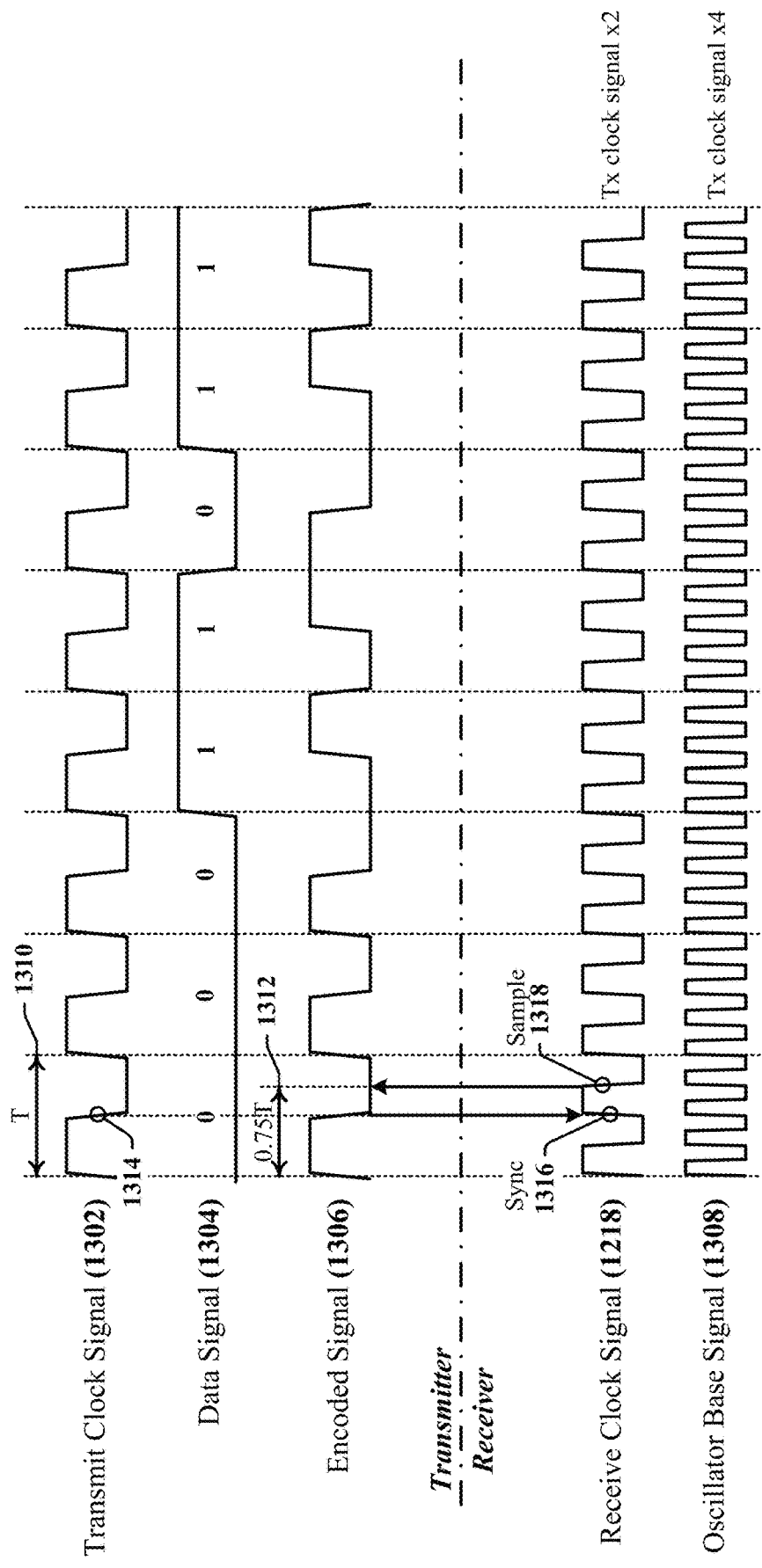
FIG. 13 illustrates a data read transaction in a receiver equipped with a Manchester decoder configured in accordance with certain aspects disclosed herein.

FIG. 13 illustrates a data read transaction 1300 in a receiver that is configured in accordance with certain aspects disclosed herein. The receiver may, for example, be equipped with the Manchester decoder 1200 illustrated in FIG. 12. In the illustrated example, an encoder in the transmitter receives a serialized data signal 1304. The encoder encodes the data signal 1304 in accordance with timing provided by a transmit clock signal 1302 to produce a Manchester encoded signal 1306. In one example, the period of the transmit clock signal 1302 defines a bit transmission interval 1310 (T) corresponding to a transmit clock frequency of 52 MHz. The encoded signal is transmitted over SDA 1210. FIG. 13 relates to maintenance of clock synchronization during datagram transmissions and transmissions of SoF, EoF or synchronization pulses are not shown.

The Manchester decoder 1200 operates using clock signals 1216 provided by the clock generator 1206. The clock generator 1206 includes a programmable oscillator that is configurable to produce an oscillator base signal 1308 at four times (4×) the frequency of the transmit clock signal 1302. The receive clock signal 1218 has a frequency that is twice (2×) the frequency of the transmit clock signal 1302 and may be obtained by dividing the oscillator base signal 1308 by two. The synchronization circuit 1204 may be configured to adjust the phase and/or frequency of the oscillator base signal 1308 to obtain a rising edge 1316 in the receive clock signal 1218 that is phase aligned with a falling edge 1314 in the transmit clock signal 1302. The falling edge 1314 in the transmit clock signal 1302 corresponds to the center of the bit transmission interval 1310 and thereby corresponds to a guaranteed transition of the Manchester encoded signal 1306.

The Manchester decoder 1200 typically does not have direct access to the transmit clock signal 1302 and therefore synchronizes its clock signals 1216 to edges in the Manchester encoded signal 1306. The Manchester decoder 1200 can reliably decode data from the Manchester encoded signal 1306 provided transitions at the edge of the bit transmission interval 1310 are not interpreted as transitions at the center of the bit transmission interval 1310. In some examples, successful decoding of data can be guaranteed when combined phase and frequency errors are limited to 10%. The synchronization circuit 1204 may be configured to adjust the phase of the oscillator base signal 1308 in every bit transmission interval 1310 in which a phase shift is detected. In some instances, the phase is adjusted by adjusting a delay circuit that is used to determine frequency of the oscillator base signal 1308. Adjusting the phase of the oscillator base signal 1308 may also cause the frequency of the oscillator base signal 1308 to be changed.

In one aspect of this disclosure, the ability to adjust the phase of the oscillator base signal 1308 in every bit transmission interval 1310 generates an expectation that SDA 1210 can be reliably captured or sampled regardless of the number of bits in the data transmission because phase and/or frequency errors do not accumulate. In the illustrated example, SDA 1210 is captured using the flipflop 1208. Each data bit may be captured at the falling edge 1318 of the receive clock signal 1218 that immediately follows the center of the bit transmission interval 1310, as represented by rising edge 1316 in the receive clock signal 1218, which nominally occurs after a 0.75 T delay 1312 from the start of the bit transmission interval 1310.

Figure 14:
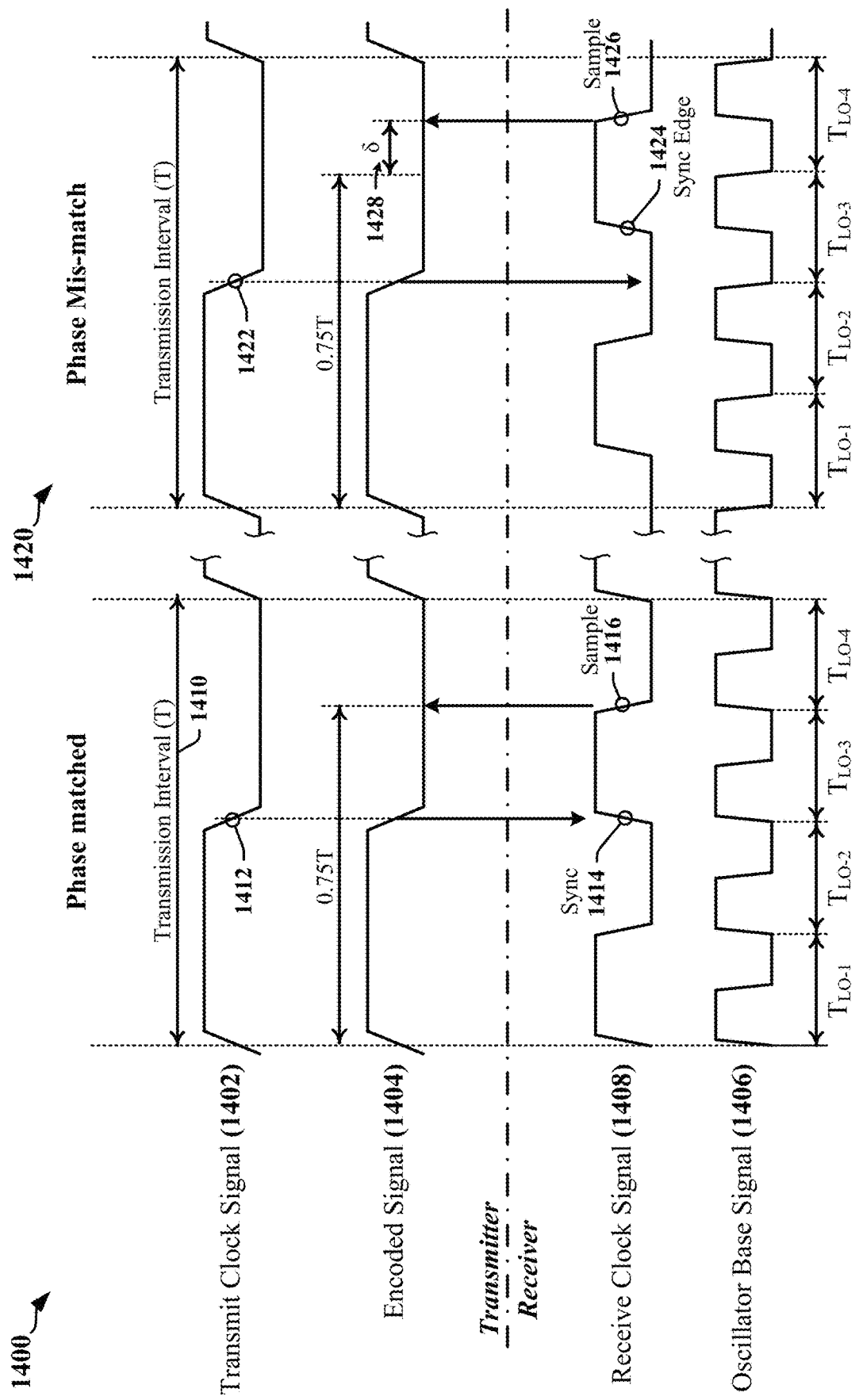
FIG. 14 provides a comparison of a phase-matched data read transaction and a phase-mismatched data read transaction using a Manchester decoder configured in accordance with certain aspects disclosed herein.

FIG. 14 provides a comparison of a phase-matched data read transaction 1400 and a phase-mismatched data read transaction 1420 in a receiver equipped with a Manchester decoder 1200 configured in accordance with certain aspects disclosed herein. In the illustrated example, an encoder in the transmitter generates a Manchester encoded signal 1404 in accordance with timing provided by a transmit clock signal 1402. In one example, the period of the transmit clock signal 1402 defines a bit transmission interval 1410 (T) corresponding to a transmit clock frequency of 52 MHz. The encoded signal is transmitted over SDA 1210.

The Manchester decoder 1200 operates using a receive clock signal 1408 provided by the clock generator 1206 located in the receiver. The clock generator 1206 includes a programmable oscillator that is configurable to produce an oscillator base signal 1406 at four times (4×) the frequency of the transmit clock signal 1402. The receive clock signal 1408 has a frequency that is twice (2×) the frequency of the transmit clock signal 1402 and may be obtained by dividing the oscillator base signal 1406 by two.

With reference to the phase-matched data read transaction 1400, the synchronization circuit 1204 may control the phase and/or frequency of the oscillator base signal 1406 such that a rising edge 1414 in the receive clock signal 1408 is phase aligned with a falling edge 1412 in the transmit clock signal 1402. In the illustrated example, the falling edge 1412 in the transmit clock signal 1402 corresponds to the center of the bit transmission interval 1410 and thereby corresponds to a guaranteed transition in the Manchester encoded signal 1404.

The Manchester decoder 1200 does not have direct access to the transmit clock signal 1402 and therefore synchronizes its clock signals 1216 to edges in the Manchester encoded signal 1404. In the phase-matched data read transaction 1400, the Manchester decoder 1200 can reliably decode data from the Manchester encoded signal 1404.

The phase-mismatched data read transaction 1420 relates to circumstances in which the phase and/or frequency of the oscillator base signal 1406 can drift due to channel noise or PVT variances. Phase mismatch may be caused by frequency or phase errors that cause a rising edge 1424 in the receive clock signal 1408 to be out of phase alignment with a corresponding falling edge 1422 in the transmit clock signal 1402. In the illustrated example, the rising edge 1424 in the receive clock signal 1408 is delayed by a certain duration 1428 and causes the misalignment with the falling edge 1422 in the transmit clock signal 1402.

The falling edge 1422 in the transmit clock signal 1402 may mark the center of the bit transmission interval 1410 and a corresponding edge transition of the Manchester encoded signal 1404. In some instances, the phase misalignment can be attributed to PVT variations or other sources of oscillator drift. In some instances, the relationship between the falling edge 1422 in the transmit clock signal 1402 and the corresponding edge transition of the Manchester encoded signal 1404 may drift due to channel noise. In either case, the receive clock signal 1408 and the transmit clock signal 1402 can fall out of synchronization. The implementation of synchronization per bit transmission interval typically limits the duration 1428 of the delay between the falling edge 1422 in the transmit clock signal 1402 and the rising edge 1424 in the receive clock signal 1408, such that the Manchester decoder 1200 can reliably decode data from the Manchester encoded signal 1404 in the presence of phase shift.

The synchronization circuit 1204 may be configured to detect the duration 1428 of the delay and to adjust the phase of the oscillator base signal 1406 accordingly. In some instances, the phase is adjusted by adjusting a delay circuit that is used to determine frequency of the oscillator base signal 1406. In some instances, adjusting the phase of the oscillator base signal 1406 can result in the frequency of the oscillator base signal 1406 being adjusted.

In one aspect of this disclosure, the ability to adjust the phase of the oscillator base signal 1406 in every bit transmission interval 1410 limits phase shift per bit transmission interval 1410 and can support an expectation that data can be reliably captured or sampled from SDA 1210 regardless of the number of bits in the data transmission because phase and/or frequency errors do not accumulate when the presently disclosed decoder is used. In the illustrated example, the signaling state of SDA 1210 is captured using the flipflop 1208. Each data bit may be captured at the falling edges 1416, 1426 of the receive clock signal 1218 that immediately follow the center of the bit transmission interval 1410, as represented by transitions detected in the Manchester encoded signal 1404.

Figure 15:
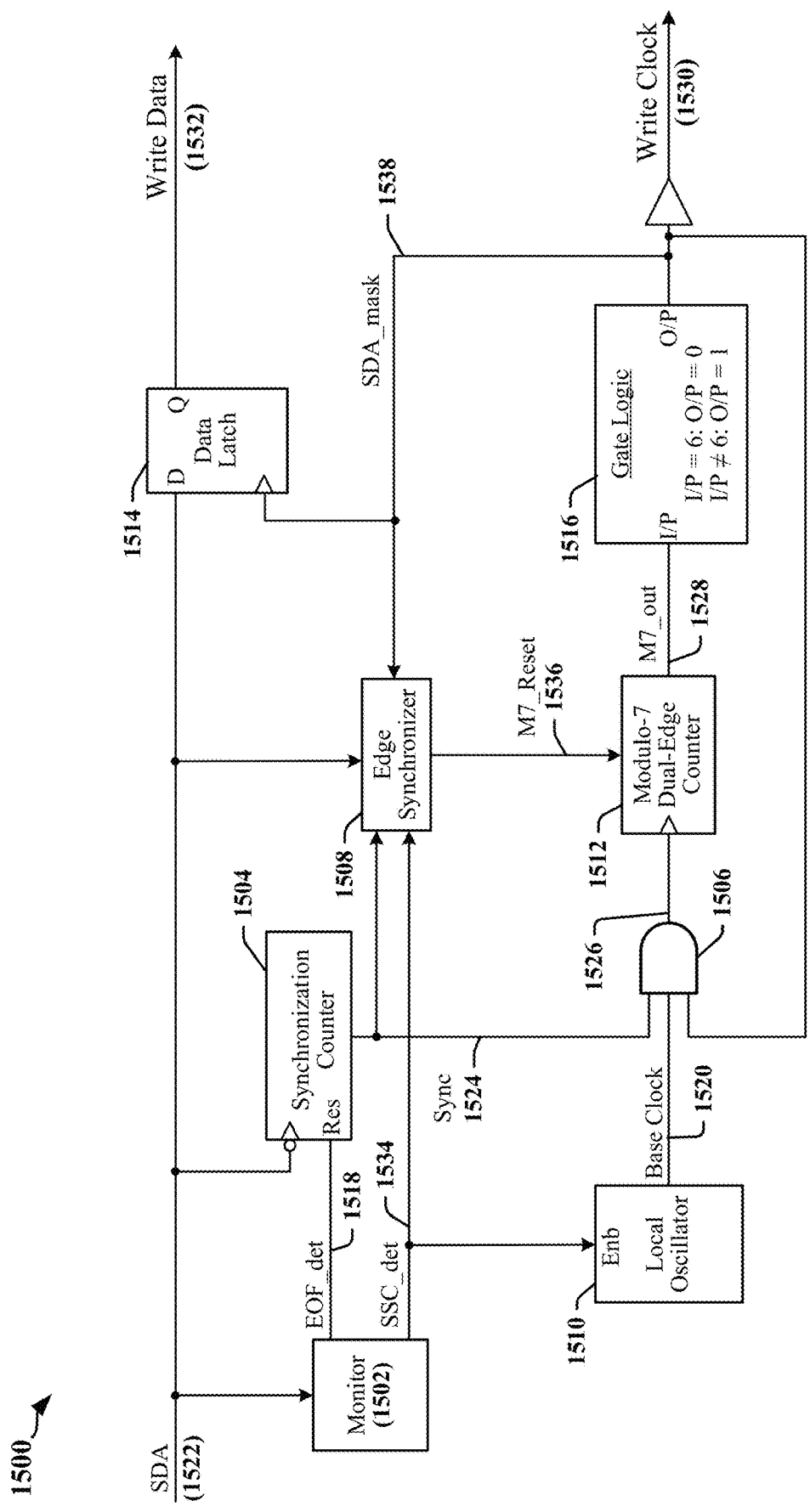
FIG. 15 illustrates a first example of a clock and data recovery circuit that may be used to generate a receive clock and decode data in a Manchester decoder configured in accordance with certain aspects of this disclosure.

FIG. 15 illustrates a first example of a clock and data recovery circuit 1500 that may be used to generate a receive clock and to decode data in a Manchester decoder configured in accordance with certain aspects of this disclosure. The circuit illustrated in FIG. 15 and circuits in other drawings are provided as examples. These drawings include certain edge sensitive devices that can be sensitive to positive edges, sensitive to negative edges or sensitive to both positive and negative edges. These edge sensitive devices are tailored to the requirements of the illustrated circuits, which are provided to facilitate description of certain aspects of the disclosure. Other circuit designs are contemplated in which some of the devices illustrated in FIG. 15 and in other drawings may be sensitive to different transitions than those depicted. For example, a synchronization bit counter 1504 in FIG. 15 is depicted as being responsive to negative edges although in other implementations the synchronization bit counter 1504 may be responsive to positive edges. It is contemplated that flipflops, counters, registers and other circuits discussed or depicted in this disclosure can be implemented using positive edges, negative edges or both edges as required by a specific design implementation.

The illustrated clock and data recovery circuit 1500 includes a state monitor 1502 configured to monitor and respond to activity or changes in activity on a one-wire serial bus (SDA 1522). For example, the state monitor 1502 may be configured to detect an SSC and the occurrence of EoF conditions in signals received from SDA 1522. The state monitor 1502 may determine that an SSC has been received after a period of idle time on SDA 1522. The SSC may be identified based on its configuration and duration. The state monitor 1502 may assert a control signal (SSC_det signal 1534) to indicate that a valid SSC has been received. In the illustrated example, the SSC_det signal 1534 is provided to a local oscillator 1510 and an edge synchronization circuit 1508.

When asserted, the SSC_det signal 1534 indicates that an SSC has been detected and enables or activates the local oscillator 1510. The local oscillator 1510 may be configured to generate a base clock signal 1520 having a base frequency ($f_{base}$), when enabled. In one example, $f_{base}$=4×52 MHz=208 MHz. In another example, $f_{base}$>208 MHz. In some instances, $f_{base}$ <208 MHz. In the illustrated example, the base clock signal 1520 is provided to a modulo-7 counter 1512 through a base clock AND gate 1506 that responds to various control signals 1534, 1538 indicating state information associated with the clock and data recovery circuit 1500.

In the illustrated example, the base clock AND gate 1506 blocks the base clock signal 1520 until a requisite or preconfigured number of synchronization pulses have been received. In the illustrated example, each synchronization pulse corresponds to a Manchester encoded zero-value bit. A delay provided between the SSC and synchronization pulses may be configured to provide sufficient time for the local oscillator 1510 to attain oscillation stability.

In the illustrated example, the synchronization bit counter 1504 is enabled after the SSC has been received or detected. The synchronization bit counter 1504 is configured to count mid-point transitions in the Manchester-encoded signal received from SDA 1522. In one example, the synchronization pulses include negative transitions at the mid-point of their corresponding bit transmission intervals. In another example, the synchronization pulses include positive transitions at the mid-point of their corresponding bit transmission intervals. In another example, the synchronization pulses include a combination of positive and negative transitions at the mid-point of their corresponding bit transmission intervals. The synchronization bit counter 1504 may synchronize receive circuits in the clock and data recovery circuit 1500 based on timing of the mid-point transitions in the synchronization pulses. The synchronization bit counter 1504 may be configured to halt counting at a predefined or preconfigured count value corresponding to the number of expected synchronization pulses. In the illustrated example, protocol specifies that two synchronization pulses are to be expected. In one example, the synchronization bit counter 1504 may be self-gated, whereby included logic circuits operate to halt counting after the expected quantity of synchronization pulses have been detected and counted. In other examples, the synchronization bit counter 1504 may be coupled to logic circuits that disable counting after the expected quantity of synchronization pulses have been detected and counted.

The output of the synchronization bit counter 1504 may continue to indicate the count value reached before counting was halted until the synchronization bit counter 1504 is reset. In some examples, the synchronization bit counter 1504 is reset when an EoF_det signal 1518 is asserted by the state monitor 1502 upon detection of an EoF in the signal received over SDA 1522. A Sync signal 1524 may be provided by the synchronization bit counter 1504 or by logic circuits associated with the synchronization bit counter 1504. The Sync signal 1524 can be used to indicate that the synchronization pulses have been detected. In the illustrated example, the Sync signal 1524 is driven high when asserted, and is connected to an input of the base clock AND gate 1506. In some implementations, the Sync signal 1524 is driven directly by the synchronization bit counter 1504 using a counter output bit that represents a binary-weighted value. In some implementations, the Sync signal 1524 is generated by combinational logic coupled to the output of the synchronization bit counter 1504. In some implementations, the synchronization bit counter 1504 is set to a non-zero value during reset and the Sync signal 1524 represents a counter overflow condition.

The third input to the base clock AND gate 1506 is controlled by the output of gate control logic 1516. The gate control logic 1516 drives its output (SDA_mask signal 1538) high when the output (the $M7_{out}$ signal 1528) of the modulo-7 counter 1512 indicates a count value $M7_{out}<6$ and drives its output low when the $M7_{out}$ signal 1528 indicates a count value $M7_{out}=6$. Accordingly, the third input to the base clock AND gate 1506 is high when $M7_{out}<6$.

In some implementations, the edge synchronization circuit 1508 drives an M7_Reset signal 1536 that is used to reset the modulo-7 counter 1512, when asserted. The edge synchronization circuit 1508 may respond to the state of SDA 1522 as indicated by the SSC_det signal 1534 and the Sync signal 1524 and to edges in a Manchester-encoded signal transmitted over SDA 1522. The M7_Reset signal 1536 may be initially asserted and remain asserted until the Sync signal 1524 is asserted. The Sync signal 1524 is asserted on the falling edge of the last synchronization pulse that is received after an SSC has been detected or after a line turnaround. The modulo-7 counter 1512 starts to count when the M7_Reset signal 1536 is deasserted after the Sync signal 1524 is asserted.

The modulo-7 counter 1512 is configured to count both positive-transitioning edges and negative-transitioning edges in the gated base clock signal 1526 output by the base clock AND gate 1506. The modulo-7 counter 1512 actively counts after the SSC and the synchronization pulses have been received. The SDA_mask signal 1538 is in a high logic state when the modulo-7 counter 1512 is reset and remains high until the modulo-7 counter 1512 reaches a count value of 6, corresponding to six edges of the gated base clock signal 1526. The six edges of the gated base clock signal 1526 cover 75% of the bit interval or clock cycle used to encode a bit of data in the Manchester-encoded signal. When the SDA_mask signal 1538 transitions low, the base clock signal 1520 is blocked, and counting by the modulo-7 counter 1512 is halted.

The SDA_mask signal 1538 is used to gate an input of the edge synchronization circuit 1508 that receives the Manchester-encoded signal transmitted over SDA 1522. When the SDA_mask signal 1538 is high, the Manchester-encoded signal is blocked at the input of the edge synchronization circuit 1508. When the SDA_mask signal 1538 is low, the Manchester-encoded signal is passed to the logic circuits within the edge synchronization circuit 1508 and a next edge in the Manchester-encoded signal causes the M7_Reset signal 1536 to be asserted. The configuration of the modulo-7 counter 1512 causes the edge synchronization circuit 1508 to ignore transitions that can occur at the boundaries of the bit transmission intervals in the Manchester-encoded signal. After reaching a count value of 6, the modulo-7 counter 1512 is reset by the next-occurring edge in the Manchester-encoded signal, the next-occurring edge corresponding to the transition at the center of a bit transmission interval. The modulo-7 counter 1512 may respond to early or late transitions in the Manchester-encoded signal that occur within the last 25% of a bit transmission interval.

The edge synchronization circuit 1508 can account for phase errors. The modulo-7 counter 1512 is reset by the transition at the center of every bit transmission interval in the Manchester-encoded signal and prevents accumulation of phase errors. In some implementations, phase information may be provided to the local oscillator 1510 by the edge synchronization circuit 1508. The feedback information may be used to adjust the frequency of the base clock signal 1520 when phase errors of similar magnitude are observed in multiple sequential bit transmission intervals in the Manchester-encoded signal.

A write clock signal 1530 may be derived from the SDA_mask signal 1538 that is output by the gate control logic 1516. The write clock signal 1530 may be used to write the data output 1532 of the clock and data recovery circuit 1500 to an external flipflop, shift register or other storage device. In the illustrated example, the write clock signal 1530 is a buffered version of the SDA_mask signal 1538. In some examples, the write clock signal 1530 is driven directly by the gate control logic 1516. In other examples, the SDA_mask signal 1538 is an inverted or delayed version of the SDA_mask signal 1538. The SDA_mask signal 1538 may be inverted or delayed version in order to control the time from edge detection on SDA 1522 until data is captured from SDA 1522, for example. The SDA_mask signal 1538 may be frequency divided, inverted, phase-shifted and/or delayed in order to generate a signal that mimics the bus clock signal (e.g., SCLK) expected by conventional 2-wire bus interface circuits.

In the illustrated example, the SDA_mask signal 1538 is used to clock a data latch 1514. In other examples, the data latch 1514 is clocked by a signal generated by combinational logic coupled to the output of the modulo-7 counter 1512 or by a signal representative of one or more bits output by the modulo-7 counter 1512. In the illustrated example, the data latch 1514 provides the data output 1532 of the clock and data recovery circuit 1500.

Figure 16:
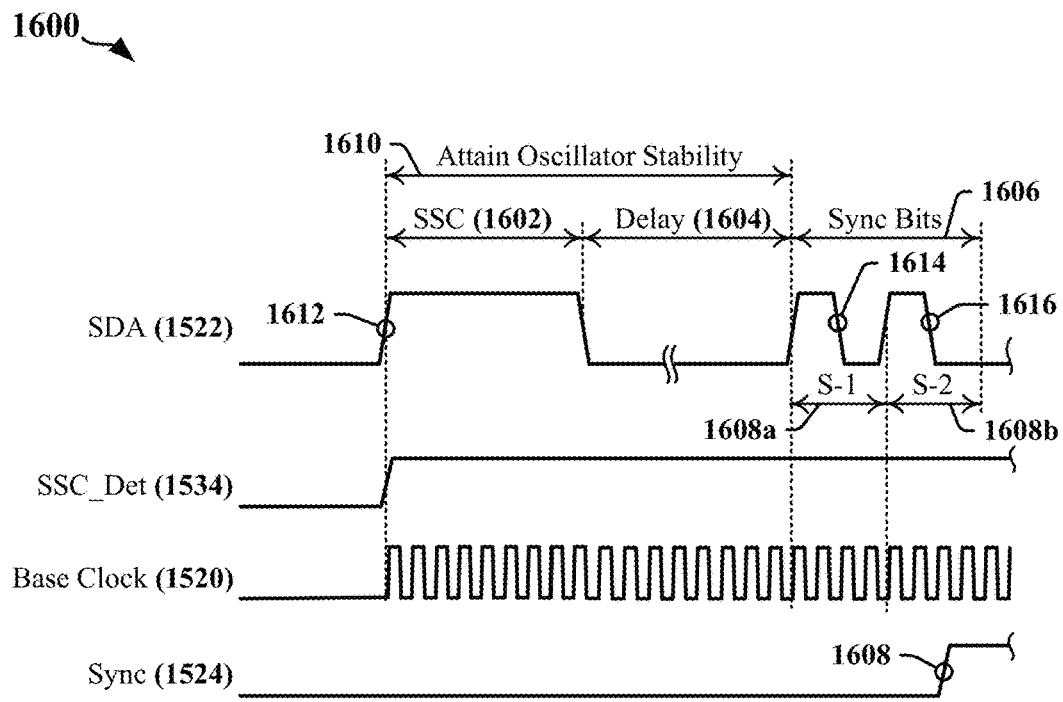
FIG. 16 illustrates certain aspects of the operation of the clock and data recovery circuit illustrated in FIG. 15.
Figure 16:
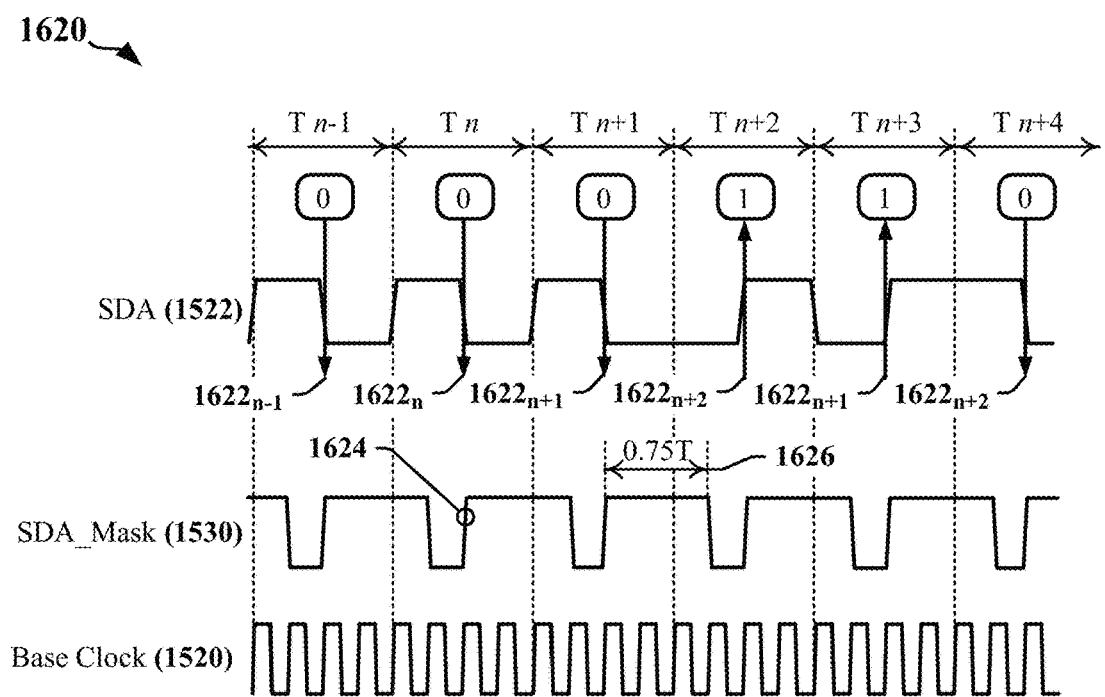

FIG. 16 illustrates certain aspects of the operation of the clock and data recovery circuit 1500 illustrated in FIG. 15. The timing diagram 1600 relates to signaling associated with startup of the clock and data recovery circuit 1500 coupled to SDA 1522 of a single-wire bus. The start of a transmission may be indicated by an SSC 1602. The state monitor 1502 may recognize a pulse of a predefined or preconfigured minimum length as a valid SSC and may assert the SSC_det signal 1534. In the illustrated example, the SSC_det signal 1534 is asserted at the rising edge 1612 of the SSC 1602 to maximize the time available 1610 to attain oscillator stability. A minimum time to attain oscillator stability defined for the one-wire interface may be met as a combination of the duration of the SSC 1602 and a delay 1604 before receipt of synchronization bits 1606. The local oscillator 1510 responds to the assertion of the SSC_det signal 1534 by enabling generation of the base clock signal 1520.

The synchronization bit counter 1504 is enabled after the SSC has been detected and validated. In the illustrated example, the synchronization bit counter 1504 is configured to count transitions 1614, 1616 in each of the synchronization bits 1606 that are negative transitions. By protocol or configuration, the transitions 1614, 1616 in the synchronization bits 1606 are expected to occur at the mid-points of the bit transmission intervals 1608*a*, 1608*b*. The transitions 1614, 1616 in the illustrated synchronization bits 1606 provide a timing reference that can be used to begin decoding of data from the Manchester-encoded signal to be transmitted over SDA 1522.

The synchronization bit counter 1504 is configured to stop counting when the count value corresponds to the number of expected synchronization bits 1606 (here 2 synchronization bits 1606 are expected). The synchronization bit counter 1504 or a logic circuit coupled to the output of the synchronization bit counter 1504 is configured to assert a logic true (here a high signaling state) on the Sync signal 1524 indicating that two synchronization bits 1606 have been received. In some implementations, protocol defines a different number of expected synchronization bits 1606 and the Sync signal 1524 indicates that a full complement of synchronization bits 1606 have been received. The synchronization bit counter 1504 or the logic circuit coupled to the output of the synchronization bit counter 1504 is configured to continue asserting the logic true on the Sync signal 1524 until the EoF_det signal 1518 is asserted by the state monitor 1502, after detection of an EoF on SDA 1522. When a logic true is asserted in the Sync signal 1524 certain circuits in the clock and data recovery circuit 1500 are enabled and can perform per-bit synchronization on subsequent bits received from SDA 1522.

The timing diagram 1620 relates to signaling associated with per-bit synchronization on data bits received in the Manchester-encoded signal transmitted over SDA 1522. The edge synchronization circuit 1508 is configured to reset the modulo-7 counter 1512 at the transitions 1622$_{n-1}$-1622$_{n+4}$ that occur at the center of each bit transmission interval ($T_{n-1}$-$T_{n+4}$). When the modulo-7 counter 1512 is in a reset state, the SDA_mask signal 1538 is in a high signaling state. The modulo-7 counter 1512 counts six edges of the base clock signal 1520 before causing the SDA_mask signal 1538 to be driven to the low signaling state. When the SDA_mask signal 1538 is in the high signaling state, the Manchester-encoded signal transmitted over SDA 1522 is blocked at the input of the edge synchronization circuit 1508 and the edge synchronization circuit 1508 effectively ignores transitions in the Manchester-encoded signal. When the SDA_mask signal 1538 is in the low signaling state, the edge synchronization circuit 1508 responds to the next transition in the Manchester-encoded signal by resetting the modulo-7 counter 1512, thereby causing the SDA_mask signal 1538 to return to the high signaling state.

In the illustrated example, the SDA_mask signal 1538 is driven high at the center of a bit transmission interval of the Manchester-encoded signal and remains in the high signaling state for a duration 1626 that is the equivalent of three quarters of a bit transmission interval. The SDA_mask signal 1538 is in a high signaling state at the boundary between each pair of consecutive transmission intervals and ignores any edges in the Manchester-encoded signal at these boundaries. In the illustrated example, rising edges 1624 in the SDA_mask signal 1538 can be used to capture data bits from the Manchester-encoded signal. In some instances, the rising edges 1624 in the SDA_mask signal 1538 are substantially coincident with edges of the Manchester-encoded signal at the center of a bit transmission interval. In these instances, the SDA_mask signal 1538 may be delayed to provide a write clock that satisfies the minimum data set up and hold times defined for the data latch 1514.

Figure 17:
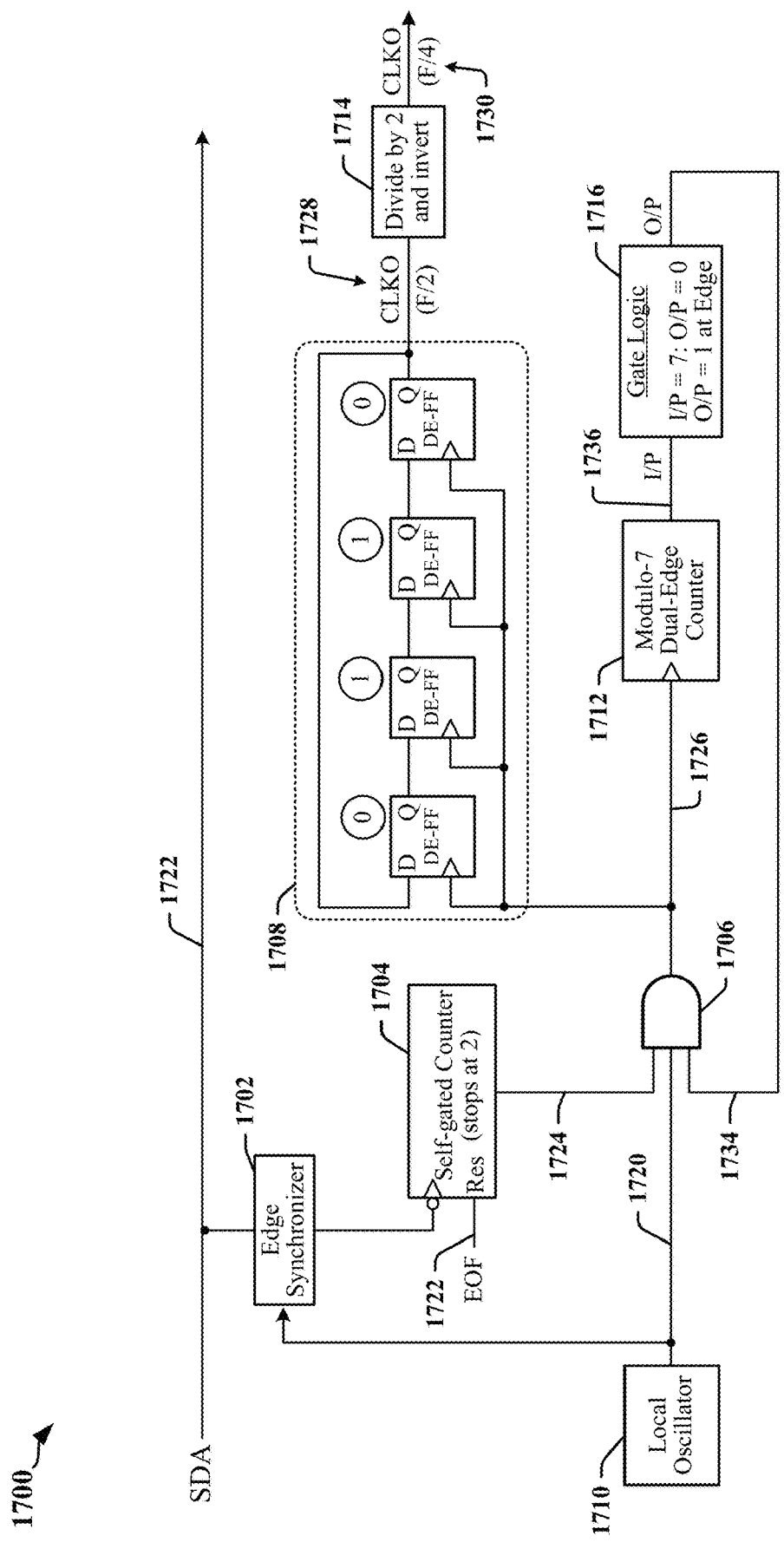
FIG. 17 illustrates certain aspects of a second example of a clock and data recovery circuit that may be used to generate a receive clock and decode data in a Manchester decoder configured in accordance with certain aspects of this disclosure.

FIG. 17 illustrates certain aspects of a second example of a clock and data recovery circuit 1700 that may be used to generate a receive clock and to decode data in a Manchester decoder configured in accordance with certain aspects of this disclosure. In this example, monitoring of the state of SDA 1722 may be handled by a monitor circuit or may be implemented using various functional elements and/or logic circuits provided in the clock and data recovery circuit 1700.

The clock and data recovery circuit 1700 includes an edge synchronization circuit 1702 configured to monitor and respond to activity or changes in activity on a one-wire serial bus (SDA 1722) and to control the operation of a local oscillator 1710 and a synchronization bit counter 1704. The edge synchronization circuit 1702 may determine that an SSC has been received in the Manchester-encoded signal transmitted over SDA 1722. The SSC may be identified or validated based on its duration. The local oscillator 1710 may be enabled upon detection of the SSC.

The local oscillator 1710 may be configured to generate a base clock signal 1720 having a base frequency ($f_{base}$), when enabled. In one example, $f_{base}$=4×52 MHz=208 MHz. In another example, $f_{base}$>208 MHz. In some instances, $f_{base}$<208 MHz. In the illustrated example, the base clock signal 1720 is provided to a modulo-7 counter 1712 through a base clock AND gate 1706 that responds to various state information.

In the illustrated example, the base clock AND gate 1706 blocks the base clock signal 1720 until a sequence of synchronization pulses have been received. In some instances, the final synchronization pulse in the sequence of synchronization pulses corresponds to a Manchester encoded bit with a value of '1'. A delay may be provided between the SSC and the synchronization pulses to provide sufficient time for the local oscillator 1710 to attain oscillation stability.

In the illustrated example, a synchronization bit counter 1704 is enabled after the SSC has been received or detected. The synchronization bit counter 1704 is configured to count negative and positive transitions. The sequence of synchronization pulses corresponds to a zero-bit followed by a non-zero bit, as encoded by the direction of the transition at the mid-point of their corresponding bit transmission intervals. The synchronization bit counter 1704 may operate to synchronize certain circuits in the clock and data recovery circuit 1700 based on timing of the positive transition in the final synchronization pulse. The synchronization bit counter 1704 may be configured to stop counting at a predefined or preconfigured count value corresponding to the number of expected synchronization pulses. In the illustrated example, protocol specifies that two synchronization pulses are to be expected. In some implementations, the synchronization bit counter 1704 is self-gated, including logic circuits that halt counting after the expected quantity of synchronization pulses have been detected and counted. In other examples, the synchronization bit counter 1704 is coupled to logic circuits that disable counting after the expected quantity of synchronization pulses have been detected and counted.

The output of the synchronization bit counter 1704 may maintain a control signal 1724 in a state that indicates that the expected count value has been reached and/or that synchronization has been completed. The control signal 1724 may continue to indicate that synchronization has been completed until the synchronization bit counter 1704 is reset. In some examples, the synchronization bit counter 1704 is reset when an EoF is detected on SDA 1722. The control signal 1724 may be coupled to and/or cause an input of the base clock AND gate 1706 to be driven high. In some implementations, the input of the base clock AND gate 1706 is driven directly by the synchronization bit counter 1704 using a counter output bit that represents a binary-weighted value. In some implementations, the input of the base clock AND gate 1706 is driven by combinational logic coupled to the output of the synchronization bit counter 1704.

The third input to the base clock AND gate 1706 is controlled by the output of a gate logic module 1716. The gate logic module 1716 drives its output 1734 low when the output 1736 ($M7_{out}$) of the modulo-7 counter 1712 indicates a count value $M7_{out}$=7 and drives its output high when an edge is detected on SDA 1722 by the edge synchronization circuit 1702. Accordingly, the third input to the base clock AND gate 1706 is high until $M7_{out}$ reaches the value of 7.

In one aspect of this disclosure, transitions on SDA 1722 are blocked from the edge synchronization circuit 1702 while the output 1734 of the gate logic module 1716 is in the high state. In another aspect of this disclosure, the base clock signal 1720 is blocked by the base clock AND gate 1706 while the output 1734 of the gate logic module 1716 is in the high state.

The clock and data recovery circuit 1700 includes a set of flipflops 1708 configured as a loop, with the input of each flipflop being coupled to the output of one other flipflop. The outputs of the flipflops in the set of flipflops 1708 are assigned a specific value upon reset where the assigned values, in sequence, are: {0, 1, 1, 0}. Each flipflop in the set of flipflops 1708 is clocked by both negative and positive edges in the gated base clock signal 1726 output by the base clock AND gate 1706. In a free running mode, a first clock signal 1728 output by the set of flipflops 1708 is substantially a square wave signal which has a frequency that is half the frequency of the gated base clock signal 1726. The first clock signal 1728 is synchronized to the transitions at the center of the bit transmission intervals in the Manchester-encoded signal. In some implementations, the quantity of flipflops in the set of flipflops 1708 can be increased to obtain a different frequency divisor. The first clock signal 1728 may be further processed to serve as a bus clock signal, such as SCLK. In one example, a conditioning circuit 1714 may provide a second clock signal 1730 with a frequency that is half the frequency of the first clock signal 1728. In some instances, the conditioning circuit 1714 may invert or phase shift the first clock signal 1728 to obtain the second clock signal 1730. The clock signals 1728, 1730 are automatically recalibrated to the timing of the Manchester-encoded signal after each bit sampling. The per-bit recalibration can prevent accumulation of clock errors and can permit sampling accuracy to be maintained regardless of datagram size.

Figure 18:
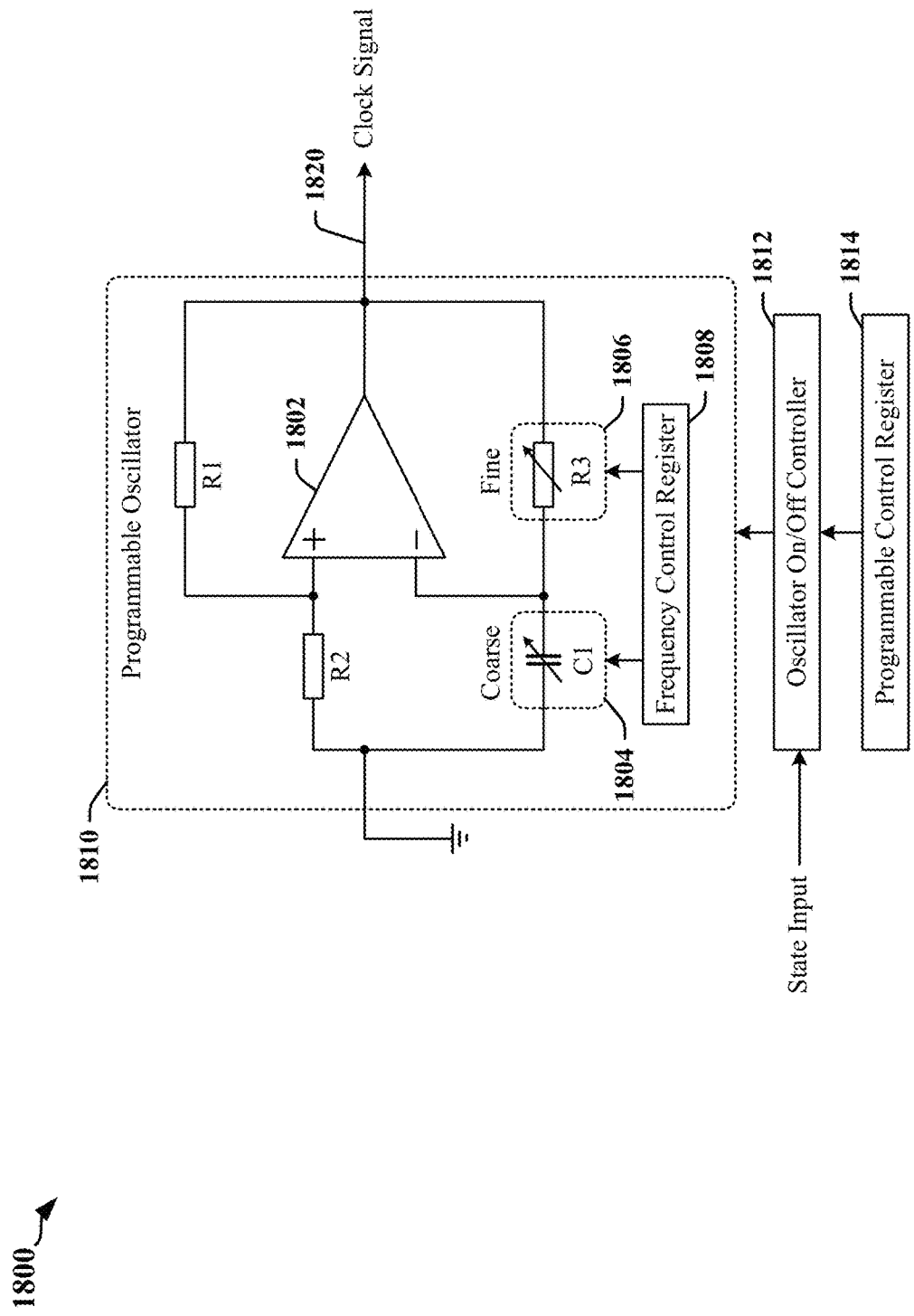
FIG. 18 illustrates certain aspects of an example of a clock generator that may be used in a clock and data recovery circuit configured in accordance with certain aspects of this disclosure.

FIG. 18 illustrates certain aspects of an example of a clock generator 1800 that may be used in a clock and data recovery circuit configured in accordance with certain aspects of this disclosure. The operation of a programmable oscillator 1810 in the clock generator 1800 may be dynamically controlled through bit settings in one or more control registers 1808, 1814. The programmable oscillator 1810 may be enabled and disabled and the frequency of the clock signal 1820 generated by the programmable oscillator 1810 may be adjusted.

In one aspect, an oscillator on/off control circuit 1812 may be configured to selectively turn-on and turn-off the output clock signal 1820. In some implementations, the oscillator on/off control circuit 1812 may respond to programmatic controls by selectively turning on or turning off the differential amplifier 1802 at the core of the programmable oscillator 1810. In some implementations, the oscillator on/off control circuit 1812 can be configured to reduce power consumption of the differential amplifier 1802 without completely powering down the differential amplifier 1802. In one example, the frequency of oscillation can be reduced by orders of magnitude to reduce power consumption.

In accordance with certain aspects of this disclosure, the oscillator on/off control circuit 1812 may respond to commands that cause oscillator turn-on events to be synchronized or triggered by one or both types of edge in a signal received from a one-wire bus. Turn-on may be programmed to be sensitive to positive edges, negative edges or to any type of edge. A default option for turn-on sensitivity may be predefined or configured. For example, a default edge sensitivity can be chosen at design time. In certain implementations described herein, a positive-edge sensitivity may be defined as a default setting.

In accordance with certain aspects of this disclosure, the oscillator on/off control circuit 1812 may respond to inactivity of the one-wire bus by causing the programmable oscillator 1810 to enter a power-down state. In one example, the programmable oscillator 1810 may be powered down after a period of inactivity on the one-wire bus. The duration of idle time before initiating power down may be predefined or configured. For example, a default minimum duration of idle time can be chosen at design time. The minimum duration of idle time may be defined or configured to ensure that a sequence of encoded data-bits, control signaling and other purposeful signaling (e.g., delays between SSC and synchronization bits) are not misinterpreted as bus inactivity. The minimum duration of idle time may be expressed in terms of quantity of generated clock signal cycles.

In certain implementations, power-down may be initiated in response to a command generated by an application or power management system. In one example, an application may elect to force power down of the programmable oscillator 1810 for battery management reasons. In another example, an application may force power down of the programmable oscillator 1810 after disabling RF interfaces or other functions in a mobile communication device.

In some implementations, the oscillator on/off control circuit 1812 can be configured through one or more programmable control registers 1814. The oscillator on/off control circuit 1812 may read configuration information from the programmable control registers 1814 after power on, in response to a command and/or as part of a control cycle. Certain information in the programmable control registers 1814 may be transferred to a frequency control register 1808 directly, or through the operation of the oscillator on/off control circuit 1812, The frequency control register 1808 may be used to control frequency of the clock signal 1820 generated by the programmable oscillator 1810. The frequency control register 1808 may be configured with a default value that defines operating frequency to be used after system power-on, after system reset or after system initialization. The frequency control register 1808 may override or overwrite the default value to modify or tune the frequency of the clock signal 1820. Some bits in the frequency control register 1808 may control the capacitance of a variable capacitor 1804. Other bits in the frequency control register 1808 may control the resistance of a variable resistor 1806. In some implementations, more than one variable capacitor 1804 and/or more than one variable resistor 1806 can be controlled through the frequency control register 1808. In the illustrated example, the variable capacitor 1804 provides coarse control of the frequency of the clock signal 1820 generated by the programmable oscillator 1810 while the variable resistor 1806 provides coarse control of the frequency of the clock signal 1820.

In some implementations, dynamic frequency control is managed by an application or by a power management system. In some instances, dynamic frequency control may be administered through datagrams received from the one-wire serial bus. The datagrams can carry information to be written to the frequency control register 1808. In some implementations, the frequency control register 1808 may be configured with multiple frequency control settings that can be selected in response to commands received from a controlling entity.

Figure 19:
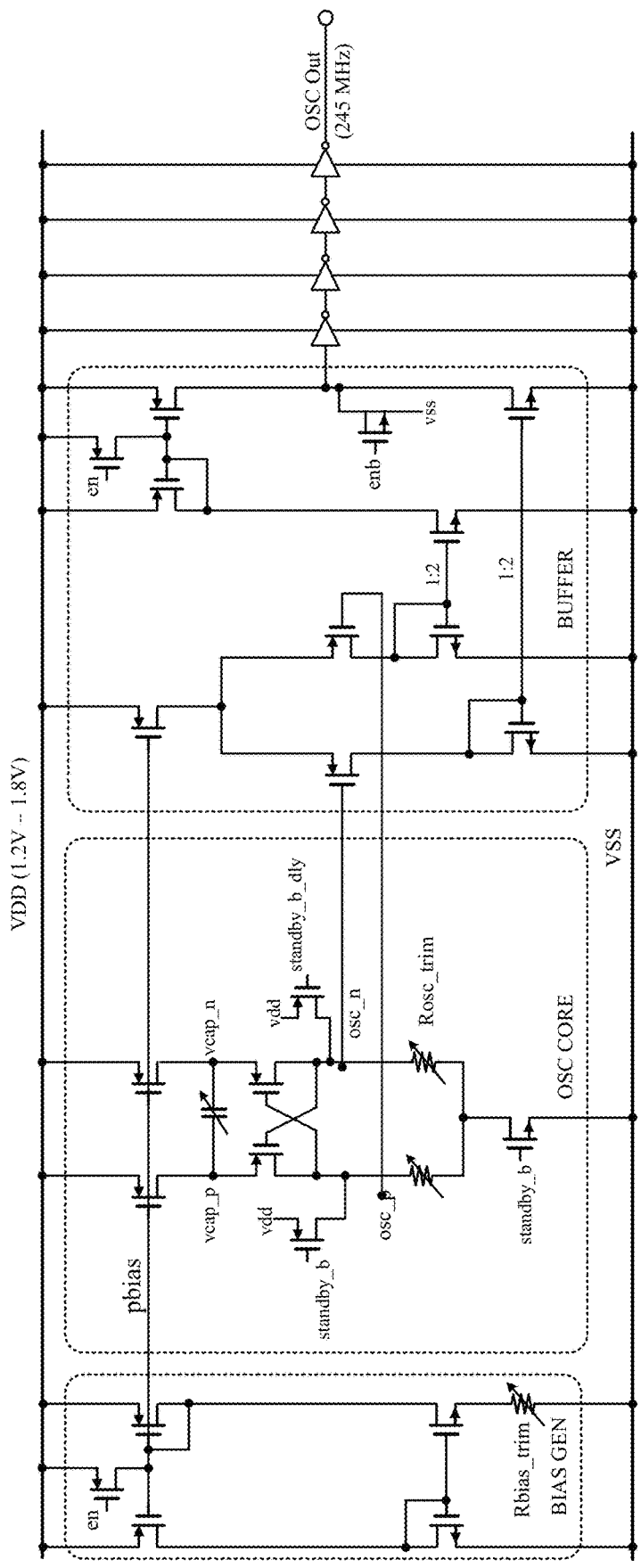
FIG. 19 illustrates one example of an oscillator that may be implemented in an IC device in accordance with certain aspects of this disclosure.

FIG. 19 illustrates one example of an oscillator 1900 that may be implemented in an IC device in accordance with certain aspects of this disclosure. The oscillator 1900 may correspond to, at least in part, to the programmable oscillator 1810 illustrated in FIG. 18.

In accordance with certain aspects of this disclosure, the oscillator 1900 may be configured to generate a clock signal with a frequency that is four times (4×) the frequency of the data-encoding clock signal at the transmitter. In one example, data is encoded using a 52 MHz by the transmitter and the oscillator 1900 may be configured to generate a base clock signal at a frequency $f_{base}$=4×52 MHz=208 MHz. The oscillator 1900 may be expected to accommodate a combined phase and frequency error of 10%.

FIGS. 18 and 19 are provided as examples of oscillators that may be used in a clock and data recovery circuit that operates in accordance with certain aspects of this disclosure. Other types of oscillators may be used, including ring oscillators and metastable oscillators. Ring oscillators may be implemented using a set of inverters in which the output of each inverter is connected to a next inverter in the ring. The output of the last inverter in the set is coupled to the input of the first inverter in the set to close the ring or loop. Ring oscillators can provide outputs at multiple different phases.

Figure 20:
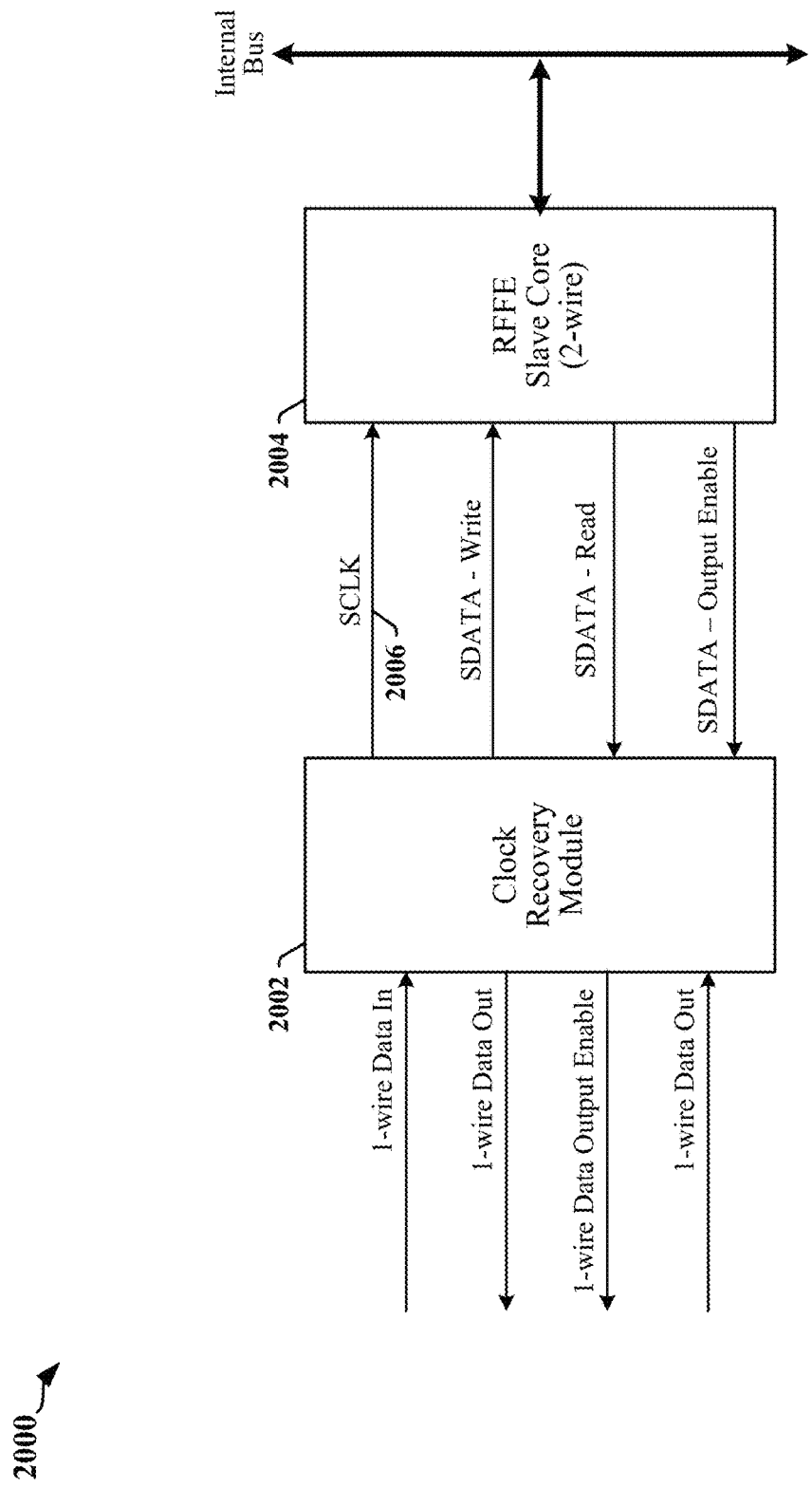
FIG. 20 illustrates an RFFE interface in which a conventional 2-wire RFFE interface can be coupled to a one-wire serial bus.

FIG. 20 illustrates an RFFE interface 2000 in which a conventional 2-wire RFFE interface can be coupled to a one-wire serial bus. When a one-wire serial bus is used for RFFE communication, SCLK 2006 is not received from the transmitting device, and a conventional RFFE core 2004 in a slave device would not have a timing reference to decode information from the data signal. A clock recovery module 2002 configured in accordance with certain aspects of this disclosure can generate a receive clock signal that conforms to the bus clock signal expected by the conventional RFFE core 2004. In one example, the clock and data recovery circuit 1700 illustrated in FIG. 17 produces a second clock signal 1730 that has the same frequency and phase of the expected bus clock signal. In the illustrated example, the clock recovery module 2002 can transmit a clock signal to the RFFE core 2004 over SCLK 2006 that complies with or is compatible with RFFE protocols. In other implementations, the clock recovery module 2002 can provide a bus clock signal that conforms or complies with a different bus protocol supported by the conventional interface.

Examples of Processing Circuits and Methods

Figure 21:
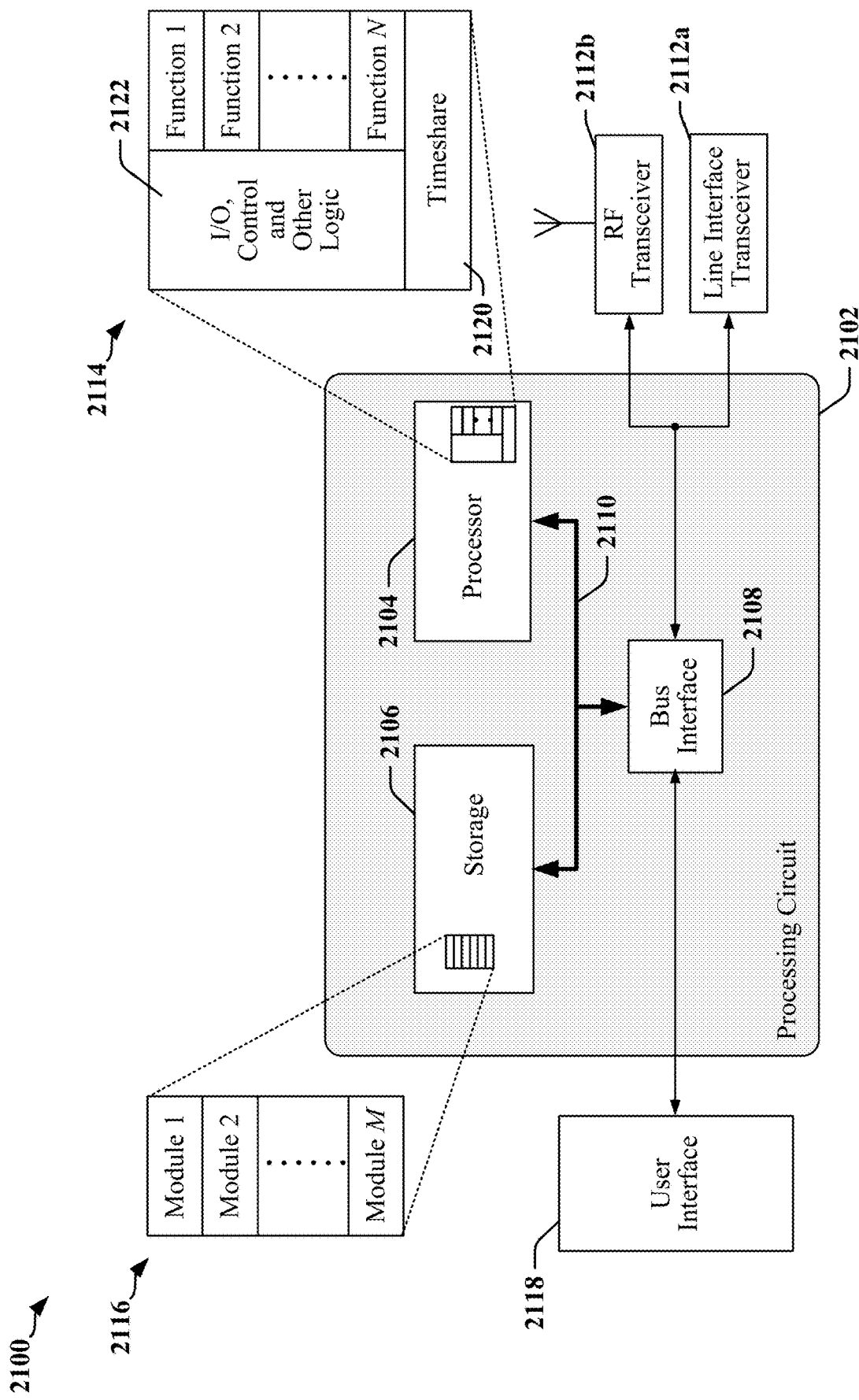
FIG. 21 illustrates one example of an apparatus employing a processing circuit that may be adapted according to certain aspects disclosed herein.

FIG. 21 is a diagram illustrating an example of a hardware implementation for an apparatus 2100. In some examples, the apparatus 2100 may perform one or more functions disclosed herein. In accordance with various aspects of the disclosure, an element, or any portion of an element, or any combination of elements as disclosed herein may be implemented using a processing circuit 2102. The processing circuit 2102 may include one or more processors 2104 that are controlled by some combination of hardware and software modules. Examples of processors 2104 include microprocessors, microcontrollers, digital signal processors (DSPs), SoCs, ASICs, field programmable gate arrays (FPGAs), programmable logic devices (PLDs), state machines, sequencers, gated logic, discrete hardware circuits, and other suitable hardware configured to perform the various functionality described throughout this disclosure. The one or more processors 2104 may include specialized processors that perform specific functions, and that may be configured, augmented or controlled by one of the software modules 2116. The one or more processors 2104 may be configured through a combination of software modules 2116 loaded during initialization, and further configured by loading or unloading one or more software modules 2116 during operation.

In the illustrated example, the processing circuit 2102 may be implemented with a bus architecture, represented generally by the bus 2110. The bus 2110 may include any number of interconnecting buses and bridges depending on the specific application of the processing circuit 2102 and the overall design constraints. The bus 2110 links together various circuits including the one or more processors 2104, and storage 2106. Storage 2106 may include memory devices and mass storage devices, and may be referred to herein as computer-readable media and/or processor-readable media. The bus 2110 may also link various other circuits such as timing sources, timers, peripherals, voltage regulators, and power management circuits. A bus interface 2108 may provide an interface between the bus 2110 and one or more transceivers 2112a, 2112b. A transceiver 2112a, 2112b may be provided for each networking technology supported by the processing circuit. In some instances, multiple networking technologies may share some or all of the circuitry or processing modules found in a transceiver 2112a, 2112b. Each transceiver 2112a, 2112b provides a means for communicating with various other apparatus over a transmission medium. In one example, a transceiver 2112a may be used to couple the apparatus 2100 to a multi-wire bus. In another example, a transceiver 2112b may be used to connect the apparatus 2100 to a radio access network. Depending upon the nature of the apparatus 2100, a user interface 2118 (e.g., keypad, display, speaker, microphone, joystick) may also be provided, and may be communicatively coupled to the bus 2110 directly or through the bus interface 2108.

A processor 2104 may be responsible for managing the bus 2110 and for general processing that may include the execution of software stored in a computer-readable medium that may include the storage 2106. In this respect, the processing circuit 2102, including the processor 2104, may be used to implement any of the methods, functions and techniques disclosed herein. The storage 2106 may be used for storing data that is manipulated by the processor 2104 when executing software, and the software may be configured to implement any one of the methods disclosed herein.

One or more processors 2104 in the processing circuit 2102 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 2106 or in an external computer-readable medium. The external computer-readable medium and/or storage 2106 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), RAM, ROM, a programmable read-only memory (PROM), an erasable PROM (EPROM) including EEPROM, a register, a removable disk, and any other suitable medium for storing software and/or instructions that may be accessed and read by a computer. The computer-readable medium and/or storage 2106 may also include, by way of example, a carrier wave, a transmission line, and any other suitable medium for transmitting software and/or instructions that may be accessed and read by a computer. Computer-readable medium and/or the storage 2106 may reside in the processing circuit 2102, in the processor 2104, external to the processing circuit 2102, or be distributed across multiple entities including the processing circuit 2102. The computer-readable medium and/or storage 2106 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 2106 may maintain software maintained and/or organized in loadable code segments, modules, applications, programs, etc., which may be referred to herein as software modules 2116. Each of the software modules 2116 may include instructions and data that, when installed or loaded on the processing circuit 2102 and executed by the one or more processors 2104, contribute to a run-time image 2114 that controls the operation of the one or more processors 2104. When executed, certain instructions may cause the processing circuit 2102 to perform functions in accordance with certain methods, algorithms and processes described herein.

Some of the software modules 2116 may be loaded during initialization of the processing circuit 2102, and these software modules 2116 may configure the processing circuit 2102 to enable performance of the various functions disclosed herein. For example, some software modules 2116 may configure internal devices and/or logic circuits 2122 of the processor 2104, and may manage access to external devices such as a transceiver 2112a, 2112b, the bus interface 2108, the user interface 2118, timers, mathematical coprocessors, and so on. The software modules 2116 may include a control program and/or an operating system that interacts with interrupt handlers and device drivers, and that controls access to various resources provided by the processing circuit 2102. The resources may include memory, processing time, access to a transceiver 2112a, 2112b, the user interface 2118, and so on.

One or more processors 2104 of the processing circuit 2102 may be multifunctional, whereby some of the software modules 2116 are loaded and configured to perform different functions or different instances of the same function. The one or more processors 2104 may additionally be adapted to manage background tasks initiated in response to inputs from the user interface 2118, the transceiver 2112a, 2112b, and device drivers, for example. To support the performance of multiple functions, the one or more processors 2104 may be configured to provide a multitasking environment, whereby each of a plurality of functions is implemented as a set of tasks serviced by the one or more processors 2104 as needed or desired. In one example, the multitasking environment may be implemented using a timesharing program 2120 that passes control of a processor 2104 between different tasks, whereby each task returns control of the one or more processors 2104 to the timesharing program 2120 upon completion of any outstanding operations and/or in response to an input such as an interrupt. When a task has control of the one or more processors 2104, the processing circuit is effectively specialized for the purposes addressed by the function associated with the controlling task. The timesharing program 2120 may include an operating system, a main loop that transfers control on a round-robin basis, a function that allocates control of the one or more processors 2104 in accordance with a prioritization of the functions, and/or an interrupt driven main loop that responds to external events by providing control of the one or more processors 2104 to a handling function.

The processing circuit 2102 may be configured to perform one or more of the functions disclosed herein. For example, the processing circuit 2102 may be configured to operate as a master device coupled to a serial bus. The processing circuit 2102 may be configured to initiate a pulse on a wire coupling the processing circuit 2102 to a slave device, present a high impedance to the wire after initiating the pulse and determine whether a slave device has terminated the pulse early, indicating a first encoded value. When the slave device has not terminated the pulse, processing circuit 2102 may be configured to terminate the pulse after a duration of time sufficient to indicate a second encoded value. In one example, the first encoded value is assigned binary 1 and the second encoded value is assigned binary 0. In another example, the first encoded value is assigned binary 0 and the second encoded value is assigned binary 1. The processing circuit 2102 may be configured to determine the encoded value or may employ a separate PWM decoder.

Figure 22:
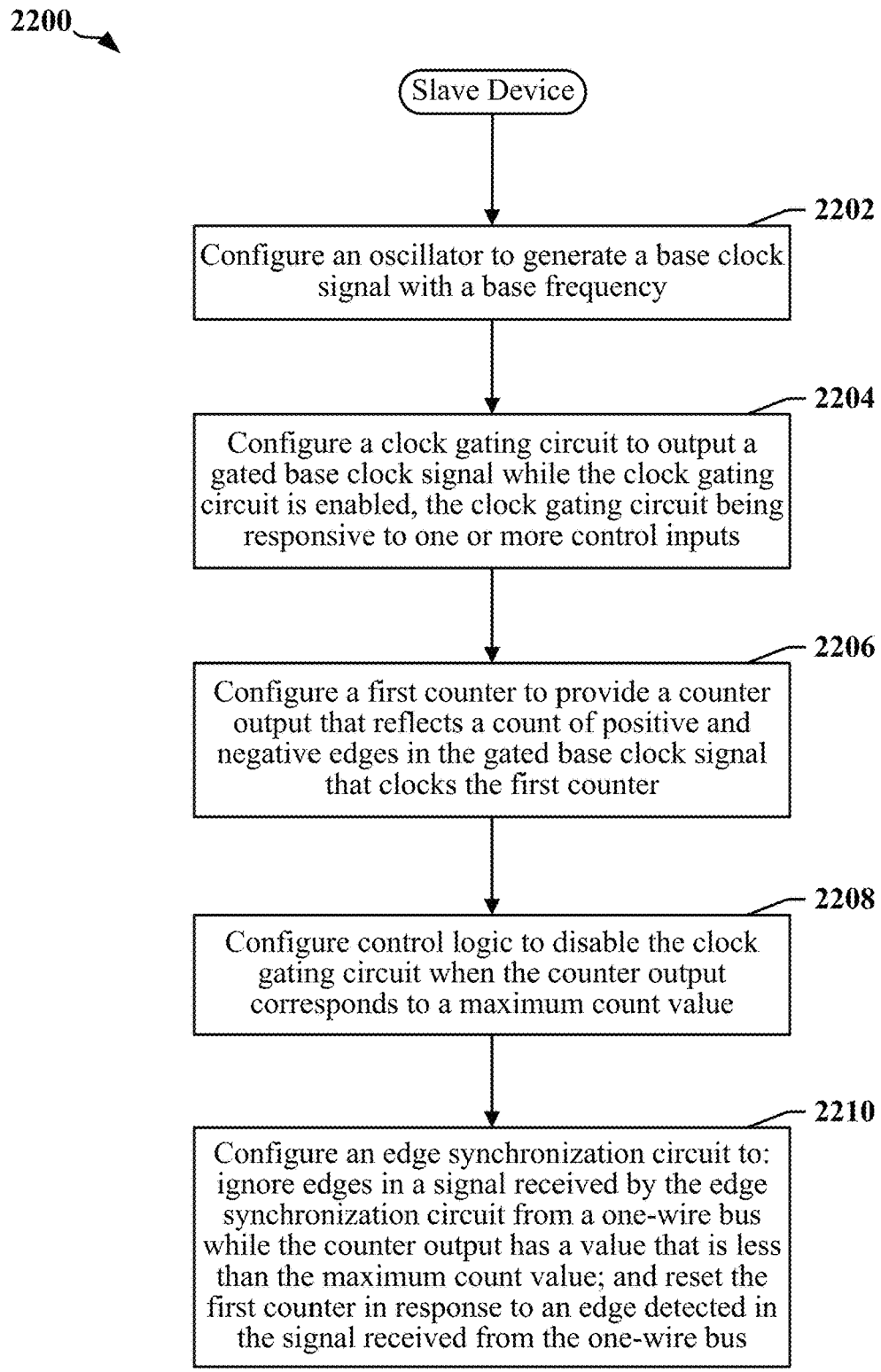
FIG. 22 is a flowchart that illustrates a method for data communication at a bus master device in accordance with certain aspects disclosed herein.

FIG. 22 is a flowchart 2200 of a method of data communication that may be performed at a slave device coupled to a one-wire serial bus. One or more slave devices may be coupled to the single-wire serial bus. A bus master device may exchange Manchester-encoded data with slave devices. The bus master device may transmit Manchester-encoded data and commands to the slave devices over the one-wire serial bus.

At block 2202, the slave device may configure an oscillator to generate a base clock signal with a base frequency. At block 2204, the slave device may configure a clock gating circuit to output a gated base clock signal while the clock gating circuit is enabled. The clock gating circuit may be responsive to one or more control inputs. At block 2206, the slave device may configure a first counter to provide a counter output that reflects a count of positive and negative edges in the gated base clock signal that clocks the first counter. At block 2208, the slave device may configure control logic to disable the clock gating circuit when the counter output corresponds to a maximum count value. At block 2210, the slave device may configure an edge synchronization circuit to ignore edges in a signal received by the edge synchronization circuit from a one-wire bus while the counter output has a value that is less than the maximum count value, and reset the first counter in response to an edge detected in the signal received from the one-wire bus. The maximum count value may be a preconfigured or reconfigurable value.

In some examples, the signal received from the one-wire bus is Manchester-encoded based on an encoding clock having a frequency that is four times greater than the frequency of the base clock signal. The encoding clock may have a frequency of at least 52 MHz.

In some examples, a flipflop is configured to capture a data bit from the one-wire bus in response to an edge detected in the signal received from the one-wire bus. A signal output by the control logic that disables the clock gating circuit may be used to clock the flipflop.

In some examples, an output signal may be generated using a signal output by the control logic that disables the clock gating circuit. The output signal may be configured to provide timing for writing data captured from the one-wire bus.

In some examples, the method includes configuring a second counter to drive a second control input of the clock gating circuit. The second counter may be clocked by the signal received from the one-wire bus. The second counter may be held in a reset state when the one-wire bus is idle and until an SSC is detected in the signal received from the one-wire bus. The second counter may be configured to halt counting when an expected number of synchronization pulses have been counted in the signal received from the one-wire bus. The clock gating circuit may be disabled until the second counter halts counting. The second counter may be reset when an output by the control logic that disables the clock gating circuit is used to generate a write clock signal that is output by the clock and data recovery apparatus.

In some examples, the signal received from the one-wire bus carries a datagram configured in accordance with a RFFE protocol and encoded using Manchester encoding.

Figure 23:
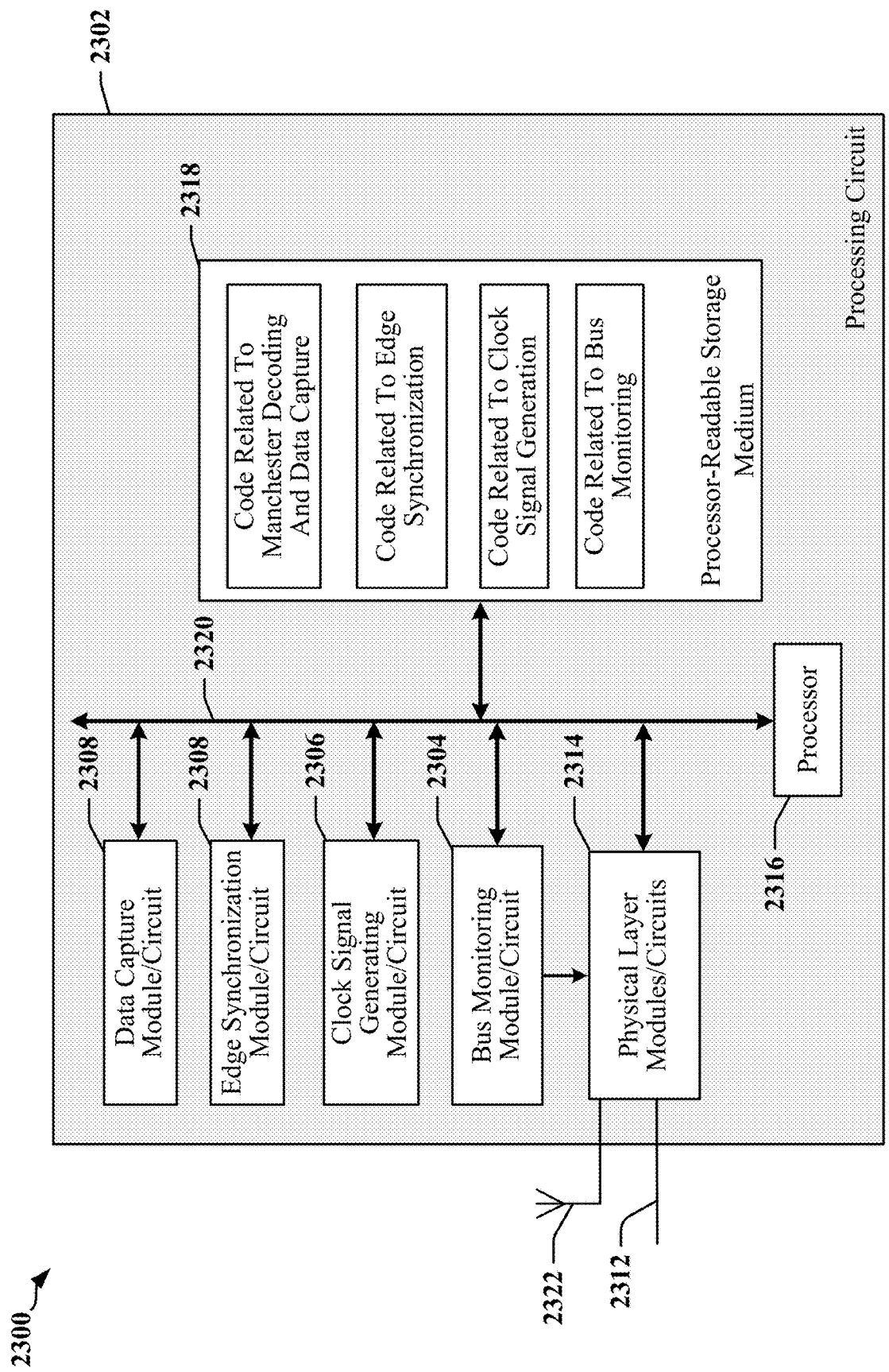
FIG. 23 illustrates an example of a hardware implementation for an apparatus adapted in accordance with certain aspects disclosed herein.

FIG. 23 is a diagram illustrating an example of a hardware implementation for an apparatus 2300 employing a processing circuit 2302. The processing circuit typically has a controller or processor 2316 that may include one or more microprocessors, microcontrollers, digital signal processors, sequencers and/or state machines. The processing circuit 2302 may be implemented with a bus architecture, represented generally by the bus 2320. The bus 2320 may include any number of interconnecting buses and bridges depending on the specific application of the processing circuit 2302 and the overall design constraints. The bus 2320 links together various circuits including one or more processors and/or hardware modules, represented by the controller or processor 2316, the modules or circuits 2304, 2306, 2308 and 2310 and the processor-readable storage medium 2318. One or more physical layer circuits and/or modules 2314 may be provided to support communication over a communication link implemented using a multi-wire bus 2312, through an antenna or antenna array 2322 (to a radio access network for example), and so on. The bus 2320 may also link various other circuits such as timing sources, peripherals, voltage regulators, and power management circuits, which are well known in the art, and therefore, will not be described any further.

The processor 2316 is responsible for general processing, including the execution of software, code and/or instructions stored on the processor-readable storage medium 2318. The processor-readable storage medium 2318 may include a non-transitory storage medium. The software, when executed by the processor 2316, causes the processing circuit 2302 to perform the various functions described herein, and for any particular apparatus. The processor-readable storage medium 2318 may be used for storing data that is manipulated by the processor 2316 when executing software. The processing circuit 2302 further includes at least one of the modules 2304, 2306, 2308 and 2310. The modules 2304, 2306, 2308 and 2310 may be software modules running in the processor 2316, resident/stored in the processor-readable storage medium 2318, one or more hardware modules coupled to the processor 2316, or some combination thereof. The modules 2304, 2306, 2308 and 2310 may include microcontroller instructions, state machine configuration parameters, or some combination thereof.

In one configuration, the apparatus 2300 includes modules and/or circuits 2304 adapted to monitor a one-wire bus for activity, inactivity and control signaling. The apparatus 2300 further includes modules and/or circuits 2306 adapted to generate one or more internal clock signals to be used for decoding a signal received over the one-wire bus. The apparatus 2300 further includes modules and/or circuits 2308 configured to synchronize an internal clock signal to edges in the signal received over the one-wire bus. The apparatus 2300 further includes modules and/or circuits 2310 adapted to capture and decode data from the signal received over the one-wire bus.

In one example, the apparatus 2300 includes physical layer circuits and/or modules 2314 that implement an interface circuit with at least one line receiver adapted or configured to couple the apparatus 2300 to a single-wire serial bus. The apparatus 2300 may have a processor 2316 or protocol controller. The apparatus 2300 may include or be coupled to a keeper circuit through the single-wire serial bus. The keeper circuit may be operable to maintain the single-wire serial bus at a constant signaling state after the line driver in the bus master device and slave devices present a high impedance to the single-wire serial bus.

The apparatus 2300 may be configured to operate as a clock and data recovery apparatus and includes an oscillator configured to generate a base clock signal with a base frequency, a clock gating circuit responsive to one or more control inputs and configured to output a gated base clock signal while the clock gating circuit is enabled, a first counter clocked by the gated base clock signal and configured to provide a counter output that reflects a count of positive and negative edges in the gated base clock signal, control logic coupled to a first control input of the clock gating circuit and configured to disable the clock gating circuit when the counter output corresponds to a maximum count value, and an edge synchronization circuit coupled to a one-wire bus. The edge synchronization circuit may be configured to ignore edges in a signal received from the one-wire bus while the counter output has a value that is less than the maximum count value, and reset the first counter in response to an edge detected in the signal received from the one-wire bus.

In various examples, the signal received from the one-wire bus is Manchester-encoded based on an encoding clock having a frequency that is four times greater than the base frequency of the base clock signal. In one example, the encoding clock has a frequency of at least 52 MHz. The clock and data recovery apparatus may include a flipflop configured to capture a data bit from the one-wire bus in response to an edge detected in the signal received from the one-wire bus. A signal output by the control logic that disables the clock gating circuit may be used to clock the flipflop. A signal output by the control logic that disables the clock gating circuit is used to generate a write clock signal that is output by the clock and data recovery apparatus.

In certain examples, the clock and data recovery apparatus includes a second counter clocked by the signal received from the one-wire bus. The second counter may be configured to drive a second control input of the clock gating circuit. The second counter may be held in a reset state when the one-wire bus is idle and until an SSC is detected in the signal received from the one-wire bus. The second counter may be configured to halt counting when an expected number of synchronization pulses have been counted in the signal received from the one-wire bus. The clock gating circuit may be disabled until the second counter halts counting. The second counter may be reset when an output by the control logic that disables the clock gating circuit is used to generate a write clock signal that is output by the clock and data recovery apparatus. The signal received from the one-wire bus may carry a datagram configured in accordance with an RFFE protocol and encoded using Manchester encoding.

The processor-readable storage medium 2318 stores code and data. The code may be executed by the processor 2316, a state machine or sequencer. The code, when executed by the processor 2316, causes the processing circuit 2302 to configure an oscillator to generate a base clock signal with a base frequency, configure a clock gating circuit to output a gated base clock signal while the clock gating circuit is enabled, the clock gating circuit being responsive to one or more control inputs, configure a first counter to provide a counter output that reflects a count of positive and negative edges in the gated base clock signal that clocks the first counter, configure control logic to disable the clock gating circuit when the counter output corresponds to a maximum count value, and configure an edge synchronization circuit. The edge synchronization circuit may be configured to ignore edges in a signal received by the edge synchronization circuit from a one-wire bus while the counter output has a value that is less than the maximum count value, and further configured to reset the first counter in response to an edge detected in the signal received from the one-wire bus.

In some examples, the signal received from the one-wire bus carries a Manchester-encoded datagram configured in accordance with an RFFE protocol. The datagram may be encoded using an encoding clock having a frequency that is four times greater than the base frequency of the base clock signal.

In certain examples, the processor-readable storage medium 2318 stores code that, when executed by the processor 2316, causes the processing circuit 2302 to configure a second counter to drive a second control input of the clock gating circuit. The second counter may be clocked by the signal received from the one-wire bus. The second counter may be held in a reset state when the one-wire bus is idle and until an SSC is detected in the signal received from the one-wire bus. The second counter may be configured to halt counting when an expected number of synchronization pulses have been counted in the signal received from the one-wire bus. The clock gating circuit may be disabled until the second counter halts counting.

Some implementation examples are described in the following numbered clauses:

1. A clock and data recovery apparatus, comprising: an oscillator configured to generate a base clock signal with a base frequency; a clock gating circuit responsive to one or more control inputs and configured to output a gated base clock signal while the clock gating circuit is enabled; a first counter clocked by the gated base clock signal and configured to provide a counter output that reflects a count of positive and negative edges in the gated base clock signal; control logic coupled to a first control input of the clock gating circuit and configured to disable the clock gating circuit when the counter output corresponds to a maximum count value; and an edge synchronization circuit coupled to a one-wire bus and configured to: ignore edges in a signal received from the one-wire bus while the counter output has a value that is less than the maximum count value; and reset the first counter in response to an edge detected in the signal received from the one-wire bus.

2. The clock and data recovery apparatus as described in clause 1, wherein the signal received from the one-wire bus is Manchester-encoded based on an encoding clock having a frequency that is four times greater than the base frequency of the base clock signal.

3. The clock and data recovery apparatus as described in clause 2, wherein the encoding clock has a frequency of at least 52 MHz.

4. The clock and data recovery apparatus as described in any of clauses 1-3, further comprising: a flipflop configured to capture a data bit from the one-wire bus in response to an edge detected in the signal received from the one-wire bus.

5. The clock and data recovery apparatus as described in clause 4, wherein a signal output by the control logic that disables the clock gating circuit is used to clock the flipflop.

6. The clock and data recovery apparatus as described in any of clauses 1-5, wherein a signal output by the control logic that disables the clock gating circuit is used to generate a write clock signal that is output by the clock and data recovery apparatus.

7. The clock and data recovery apparatus as described in any of clauses 1-6, further comprising: a second counter clocked by the signal received from the one-wire bus and configured to drive a second control input of the clock gating circuit, wherein the second counter is held in a reset state when the one-wire bus is idle and until a sequence start condition (SSC) is detected in the signal received from the one-wire bus, wherein the second counter is configured to halt counting when an expected number of synchronization pulses have been counted in the signal received from the one-wire bus, and wherein the clock gating circuit is disabled until the second counter halts counting.

8. The clock and data recovery apparatus as described in clause 7, wherein the second counter is reset when an output by the control logic that disables the clock gating circuit is used to generate a write clock signal that is output by the clock and data recovery apparatus.

9. The clock and data recovery apparatus as described in any of clauses 1-8, wherein the signal received from the one-wire bus carries a datagram configured in accordance with a Radio Frequency Front-End (RFFE) protocol and encoded using Manchester encoding.

10. A method of data communication, comprising: configuring an oscillator to generate a base clock signal with a base frequency; configuring a clock gating circuit to output a gated base clock signal while the clock gating circuit is enabled, the clock gating circuit being responsive to one or more control inputs; configuring a first counter to provide a counter output that reflects a count of positive and negative edges in the gated base clock signal that clocks the first counter; configuring control logic to disable the clock gating circuit when the counter output corresponds to a maximum count value; and configuring an edge synchronization circuit to: ignore edges in a signal received by the edge synchronization circuit from a one-wire bus while the counter output has a value that is less than the maximum count value; and reset the first counter in response to an edge detected in the signal received from the one-wire bus.
11. The method as described in clause 10, wherein the signal received from the one-wire bus is Manchester-encoded based on an encoding clock having a frequency that is four times greater than the base frequency of the base clock signal.
12. The method as described in clause 11, wherein the encoding clock has a frequency of at least 52 MHz.
13. The method as described in any of clauses 10-12, further comprising: configuring a flipflop to capture a data bit from the one-wire bus in response to an edge detected in the signal received from the one-wire bus.
14. The method as described in clause 13, wherein a signal output by the control logic that disables the clock gating circuit is used to clock the flipflop.
15. The method as described in any of clauses 10-14, further comprising: generating an output signal using a signal output by the control logic that disables the clock gating circuit, the output signal being configured to provide timing for writing data captured from the one-wire bus.
16. The method as described in any of clauses 10-15, further comprising: configuring a second counter to drive a control input of the clock gating circuit, the second counter being clocked by the signal received from the one-wire bus, wherein the second counter is held in a reset state when the one-wire bus is idle and until a sequence start condition (SSC) is detected in the signal received from the one-wire bus, wherein the second counter is configured to halt counting when an expected number of synchronization pulses have been counted in the signal received from the one-wire bus, and wherein the clock gating circuit is disabled until the second counter halts counting.
17. The method as described in clause 16, wherein the second counter is reset when an output by the control logic that disables the clock gating circuit is used to generate an output signal configured to provide timing for writing data captured from the one-wire bus.
18. The method as described in any of clauses 10-17, wherein the signal received from the one-wire bus carries a datagram configured in accordance with a Radio Frequency Front-End (RFFE) protocol and encoded using Manchester encoding.
19. A data communication apparatus, comprising: means for generating a base clock signal with a base frequency; means for gating the base clock signal, including a clock gating circuit responsive to one or more control inputs, the means for gating the base clock signal being configured to output a gated base clock signal while the clock gating circuit is enabled; means for counting positive and negative edges in the gated base clock signal, including a first counter clocked by the gated base clock signal; means for disabling the clock gating circuit, including control logic coupled to a first control input of the clock gating circuit, the means for disabling the clock gating circuit being configured to disable the clock gating circuit when an output of the first counter corresponds to a maximum count value; and means for synchronizing the means for counting positive and negative edges in the signal received from a one-wire bus, configured to: ignore edges in the signal received from the one-wire bus while the output of the first counter represents a value that is less than the maximum count value; and reset the first counter in response to an edge detected in the signal received from the one-wire bus.
20. The data communication apparatus as described in clauses 19, wherein the signal received from the one-wire bus is Manchester-encoded based on an encoding clock having a frequency that is four times greater than the base frequency of the base clock signal.
21. The data communication apparatus as described in clause 20, wherein the encoding clock has a frequency of at least 52 MHz.
22. The data communication apparatus as described in any of clauses 19-21, further comprising: means for capturing data bits from the one-wire bus responsive to edges detected in the signal received from the one-wire bus.
23. The data communication apparatus as described in clause 22, wherein the means for capturing data bits from the one-wire bus comprises a flipflop and wherein a signal output by the control logic that disables the clock gating circuit is used to clock the flipflop.
24. The data communication apparatus as described in any of clauses 19-23, wherein a signal output by the control logic that disables the clock gating circuit is used to generate a write clock signal that is output by the data communication apparatus.
25. The data communication apparatus as described in any of clauses 19-24, further comprising: means for counting synchronization pulses, including a second counter clocked by the signal received from the one-wire bus, the means for counting synchronization pulses being configured to drive a second control input of the clock gating circuit, wherein the second counter is held in a reset state when the one-wire bus is idle and until a sequence start condition (SSC) is detected in the signal received from the one-wire bus, wherein the means for counting synchronization pulses is configured to halt the second counter when an expected number of synchronization pulses have been counted in the signal received from the one-wire bus, and wherein the clock gating circuit is disabled until the second counter halts counting.
26. The data communication apparatus as described in clause 25, wherein the second counter is reset when an output by the control logic that disables the clock gating circuit is used to generate a write clock signal that is output by the data communication apparatus.
27. The data communication apparatus as described in any of clauses 19-26, wherein the signal received from the one-wire bus carries a datagram configured in accordance with a Radio Frequency Front-End (RFFE) protocol and encoded using Manchester encoding.
28. A processor-readable storage medium storing code thereon, the code when executed by a processor in a processing circuit causes the processing circuit to: configure an oscillator to generate a base clock signal with a base frequency; configure a clock gating circuit to output a gated base clock signal while the clock gating circuit is enabled, the clock gating circuit being responsive to one or more control inputs; configure a first counter to provide a counter output that reflects a count of positive and negative edges in the gated base clock signal that clocks the first counter; configure control logic to disable the clock gating circuit when the counter output corresponds to a maximum count value; and configure an edge synchronization circuit to: ignore edges in a signal received by the edge synchronization circuit from a one-wire bus while the counter output has a value that is less than the maximum count value; and reset the first counter in response to an edge detected in the signal received from the one-wire bus.

29. The processor-readable storage medium as described in clause 28, wherein the signal received from the one-wire bus carries a Manchester-encoded datagram configured in accordance with a Radio Frequency Front-End (RFFE) protocol and encoded using an encoding clock having a frequency that is four times greater than the base frequency of the base clock signal.

30. The processor-readable storage medium as described in clause 28 or clause 29, wherein the code further causes the processing circuit to: configure a second counter to drive a control input of the clock gating circuit, the second counter being clocked by the signal received from the one-wire bus, wherein the second counter is held in a reset state when the one-wire bus is idle and until a sequence start condition (SSC) is detected in the signal received from the one-wire bus, wherein the second counter is configured to halt counting when an expected number of synchronization pulses have been counted in the signal received from the one-wire bus, and wherein the clock gating circuit is disabled until the second counter halts counting.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock and data recovery apparatus, comprising:
    an oscillator configured to generate a base clock signal with a base frequency;
    a clock gating circuit responsive to one or more control inputs and configured to output a gated base clock signal while the clock gating circuit is enabled;
    a first counter clocked by the gated base clock signal and configured to provide a counter output that reflects a count of positive and negative edges in the gated base clock signal;
    control logic coupled to a first control input of the clock gating circuit and configured to disable the clock gating circuit when the counter output corresponds to a maximum count value; and
    an edge synchronization circuit coupled to a one-wire bus and configured to:
        ignore edges in a signal received from the one-wire bus while the counter output has a value that is less than the maximum count value; and
        reset the first counter in response to an edge detected in the signal received from the one-wire bus.

2. The clock and data recovery apparatus of claim 1, wherein the signal received from the one-wire bus is Manchester-encoded based on an encoding clock having a frequency that is four times greater than the base frequency of the base clock signal.

3. The clock and data recovery apparatus of claim 2, wherein the encoding clock has a frequency of at least 52 MHz.

4. The clock and data recovery apparatus of claim 1, further comprising:
    a flipflop configured to capture a data bit from the one-wire bus in response to an edge detected in the signal received from the one-wire bus.

5. The clock and data recovery apparatus of claim 4, wherein a signal output by the control logic that disables the clock gating circuit is used to clock the flipflop.

6. The clock and data recovery apparatus of claim 1, wherein a signal output by the control logic that disables the clock gating circuit is used to generate a write clock signal that is output by the clock and data recovery apparatus.

7. The clock and data recovery apparatus of claim 1, further comprising:
    a second counter clocked by the signal received from the one-wire bus and configured to drive a second control input of the clock gating circuit,
    wherein the second counter is held in a reset state when the one-wire bus is idle and until a sequence start condition (SSC) is detected in the signal received from the one-wire bus,
    wherein the second counter is configured to halt counting when an expected number of synchronization pulses have been counted in the signal received from the one-wire bus, and
    wherein the clock gating circuit is disabled until the second counter halts counting.

8. The clock and data recovery apparatus of claim 7, wherein the second counter is reset when an output by the control logic that disables the clock gating circuit is used to generate a write clock signal that is output by the clock and data recovery apparatus.

9. The clock and data recovery apparatus of claim 1, wherein the signal received from the one-wire bus carries a datagram configured in accordance with a Radio Frequency Front-End (RFFE) protocol and encoded using Manchester encoding.

10. A method of data communication, comprising:
    configuring an oscillator to generate a base clock signal with a base frequency;
    configuring a clock gating circuit to output a gated base clock signal while the clock gating circuit is enabled, the clock gating circuit being responsive to one or more control inputs;
    configuring a first counter to provide a counter output that reflects a count of positive and negative edges in the gated base clock signal that clocks the first counter;

configuring control logic to disable the clock gating circuit when the counter output corresponds to a maximum count value; and configuring an edge synchronization circuit to:
ignore edges in a signal received by the edge synchronization circuit from a one-wire bus while the counter output has a value that is less than the maximum count value; and
reset the first counter in response to an edge detected in the signal received from the one-wire bus.

11. The method of claim 10, wherein the signal received from the one-wire bus is Manchester-encoded based on an encoding clock having a frequency that is four times greater than the base frequency of the base clock signal.

12. The method of claim 11, wherein the encoding clock has a frequency of at least 52 MHz.

13. The method of claim 10, further comprising:
configuring a flipflop to capture a data bit from the one-wire bus in response to an edge detected in the signal received from the one-wire bus.

14. The method of claim 13, wherein a signal output by the control logic that disables the clock gating circuit is used to clock the flipflop.

15. The method of claim 10, further comprising:
generating an output signal using a signal output by the control logic that disables the clock gating circuit, the output signal being configured to provide timing for writing data captured from the one-wire bus.

16. The method of claim 10, further comprising:
configuring a second counter to drive a control input of the clock gating circuit, the second counter being clocked by the signal received from the one-wire bus,
wherein the second counter is held in a reset state when the one-wire bus is idle and until a sequence start condition (SSC) is detected in the signal received from the one-wire bus,
wherein the second counter is configured to halt counting when an expected number of synchronization pulses have been counted in the signal received from the one-wire bus, and
wherein the clock gating circuit is disabled until the second counter halts counting.

17. The method of claim 16, wherein the second counter is reset when an output by the control logic that disables the clock gating circuit is used to generate an output signal configured to provide timing for writing data captured from the one-wire bus.

18. The method of claim 10, wherein the signal received from the one-wire bus carries a datagram configured in accordance with a Radio Frequency Front-End (RFFE) protocol and encoded using Manchester encoding.

19. A data communication apparatus, comprising:
means for generating a base clock signal with a base frequency;
means for gating the base clock signal, including a clock gating circuit responsive to one or more control inputs, the means for gating the base clock signal being configured to output a gated base clock signal while the clock gating circuit is enabled;
means for counting positive and negative edges in the gated base clock signal, including a first counter clocked by the gated base clock signal;
means for disabling the clock gating circuit, including control logic coupled to a first control input of the clock gating circuit, the means for disabling the clock gating circuit being configured to disable the clock gating circuit when an output of the first counter corresponds to a maximum count value; and
means for synchronizing the means for counting positive and negative edges in the signal received from a one-wire bus, configured to:
ignore edges in the signal received from the one-wire bus while the output of the first counter represents a value that is less than the maximum count value; and
reset the first counter in response to an edge detected in the signal received from the one-wire bus.

20. The data communication apparatus of claim 19, wherein the signal received from the one-wire bus is Manchester-encoded based on an encoding clock having a frequency that is four times greater than the base frequency of the base clock signal.

21. The data communication apparatus of claim 20, wherein the encoding clock has a frequency of at least 52 MHz.

22. The data communication apparatus of claim 19, further comprising:
means for capturing data bits from the one-wire bus responsive to edges detected in the signal received from the one-wire bus.

23. The data communication apparatus of claim 22, wherein the means for capturing data bits from the one-wire bus comprises a flipflop and wherein a signal output by the control logic that disables the clock gating circuit is used to clock the flipflop.

24. The data communication apparatus of claim 19, wherein a signal output by the control logic that disables the clock gating circuit is used to generate a write clock signal that is output by the data communication apparatus.

25. The data communication apparatus of claim 19, further comprising:
means for counting synchronization pulses, including a second counter clocked by the signal received from the one-wire bus, the means for counting synchronization pulses being configured to drive a second control input of the clock gating circuit,
wherein the second counter is held in a reset state when the one-wire bus is idle and until a sequence start condition (SSC) is detected in the signal received from the one-wire bus,
wherein the means for counting synchronization pulses is configured to halt the second counter when an expected number of synchronization pulses have been counted in the signal received from the one-wire bus, and
wherein the clock gating circuit is disabled until the second counter halts counting.

26. The data communication apparatus of claim 25, wherein the second counter is reset when an output by the control logic that disables the clock gating circuit is used to generate a write clock signal that is output by the data communication apparatus.

27. The data communication apparatus of claim 19, wherein the signal received from the one-wire bus carries a datagram configured in accordance with a Radio Frequency Front-End (RFFE) protocol and encoded using Manchester encoding.

28. A non-transitory processor-readable storage medium storing code thereon, the code when executed by a processor in a processing circuit causes the processing circuit to:
configure an oscillator to generate a base clock signal with a base frequency;

configure a clock gating circuit to output a gated base clock signal while the clock gating circuit is enabled, the clock gating circuit being responsive to one or more control inputs;

configure a first counter to provide a counter output that reflects a count of positive and negative edges in the gated base clock signal that clocks the first counter;

configure control logic to disable the clock gating circuit when the counter output corresponds to a maximum count value; and configure an edge synchronization circuit to:
ignore edges in a signal received by the edge synchronization circuit from a one-wire bus while the counter output has a value that is less than the maximum count value; and
reset the first counter in response to an edge detected in the signal received from the one-wire bus.

29. The non-transitory processor-readable storage medium of claim 28, wherein the signal received from the one-wire bus carries a Manchester-encoded datagram configured in accordance with a Radio Frequency Front-End (RFFE) protocol and encoded using an encoding clock having a frequency that is four times greater than the base frequency of the base clock signal.

30. The non-transitory processor-readable storage medium of claim 28, wherein the code further causes the processing circuit to:

configure a second counter to drive a control input of the clock gating circuit, the second counter being clocked by the signal received from the one-wire bus, wherein the second counter is held in a reset state when the one-wire bus is idle and until a sequence start condition (SSC) is detected in the signal received from the one-wire bus, wherein the second counter is configured to halt counting when an expected number of synchronization pulses have been counted in the signal received from the one-wire bus, and wherein the clock gating circuit is disabled until the second counter halts counting.

* * * * *